(12) United States Patent
Prakash et al.

(10) Patent No.: US 12,354,682 B2
(45) Date of Patent: Jul. 8, 2025

(54) INTERMEDIATE RE-VERIFY FOR ACHIEVING TIGHTER THRESHOLD VOLTAGE DISTRIBUTIONS IN A MEMORY DEVICE

(71) Applicant: Western Digital Technologies, Inc., San Jose, CA (US)

(72) Inventors: Abhijith Prakash, Milpitas, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 176 days.

(21) Appl. No.: 18/223,782

(22) Filed: Jul. 19, 2023

(65) Prior Publication Data
US 2024/0290402 A1    Aug. 29, 2024

Related U.S. Application Data

(60) Provisional application No. 63/448,012, filed on Feb. 24, 2023.

(51) Int. Cl.
| | | |
|---|---|---|
| G11C 16/10 | (2006.01) | |
| G11C 16/12 | (2006.01) | |
| G11C 16/34 | (2006.01) | |

(52) U.S. Cl.
CPC ........ *G11C 16/3459* (2013.01); *G11C 16/102* (2013.01); *G11C 16/12* (2013.01)

(58) Field of Classification Search
CPC ...................................................... G11C 16/12
See application file for complete search history.

(56) References Cited

U.S. PATENT DOCUMENTS

| | | |
|---|---|---|
| 7,307,887 B2 | 12/2007 | Chen |
| 7,474,566 B2 * | 1/2009 | Jung ................. G11C 16/3454 365/185.04 |
| 8,908,441 B1 | 12/2014 | Dutta et al. |
| 9,165,659 B1 * | 10/2015 | Pang ................. G11C 16/0466 |
| 9,875,805 B2 | 1/2018 | Tseng et al. |
| 10,049,760 B2 | 8/2018 | Shiino et al. |

(Continued)

OTHER PUBLICATIONS

Hara et al., A 146-mm2 8-GB Multi-Level NAND Flash Memory With 70-nm CMOS Technology, IEEE Journal of Solid-State Circuits, vol. 41, No. 1, Jan. 2006.

*Primary Examiner* — Douglas King
(74) *Attorney, Agent, or Firm* — Dickinson Wright PLLC

(57) ABSTRACT

The memory device includes a memory block with memory cells arranged in word lines and control circuitry that is configured to program the memory cells in a selected word line to respective programmed data states in program loops, which each include verify operations. The control circuitry is further configured to lock out any of the memory cells in the selected word line memory cell from subsequent program pulses and verify operations in response to that memory cell passing verify for its respective programmed data state. For a selected programmed data state, the control circuitry is further configured to re-verify all of the memory cells in the selected word line that are being programmed to the selected programmed data state and release all memory cells that were locked out but fail re-verify in order to allow any memory cells that mistakenly passed verify to be programmed further.

20 Claims, 18 Drawing Sheets

(56) References Cited

U.S. PATENT DOCUMENTS

| | | | |
|---|---|---|---|
| 2007/0153594 A1* | 7/2007 | Chen | G11C 16/12 |
| | | | 365/195 |
| 2013/0088916 A1* | 4/2013 | Sarpatwari | G11C 16/3454 |
| | | | 365/185.02 |
| 2016/0217869 A1* | 7/2016 | Tseng | G11C 16/3459 |
| 2016/0314843 A1* | 10/2016 | Tseng | G11C 11/5671 |

* cited by examiner

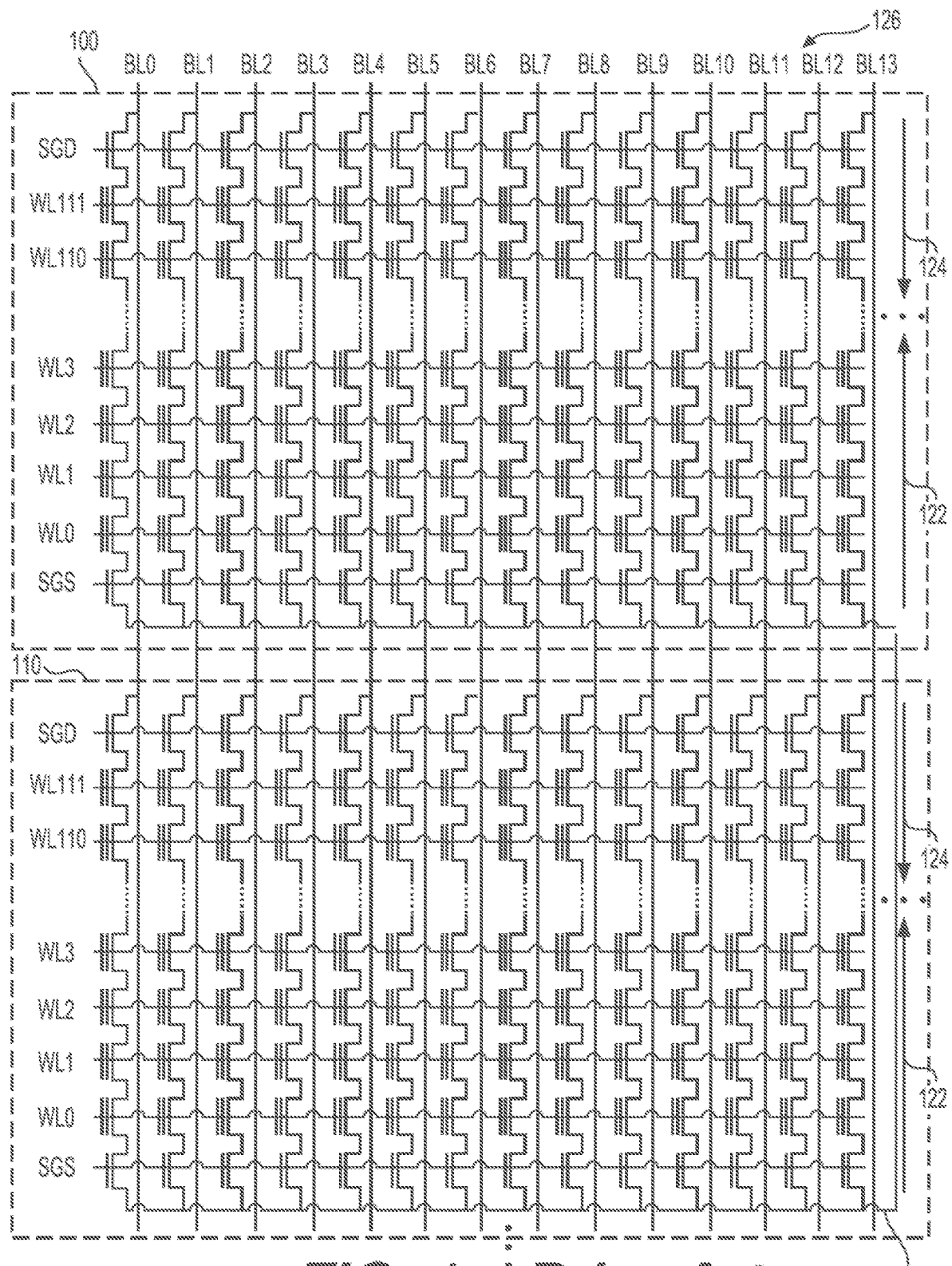
FIG. 1 – Prior Art

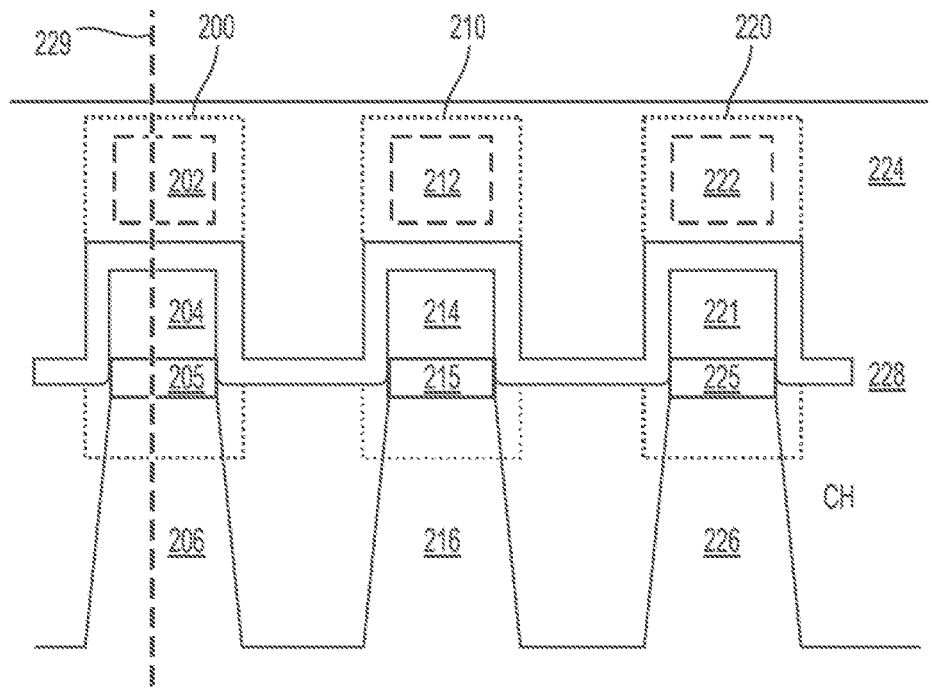
FIG. 2A - Prior Art
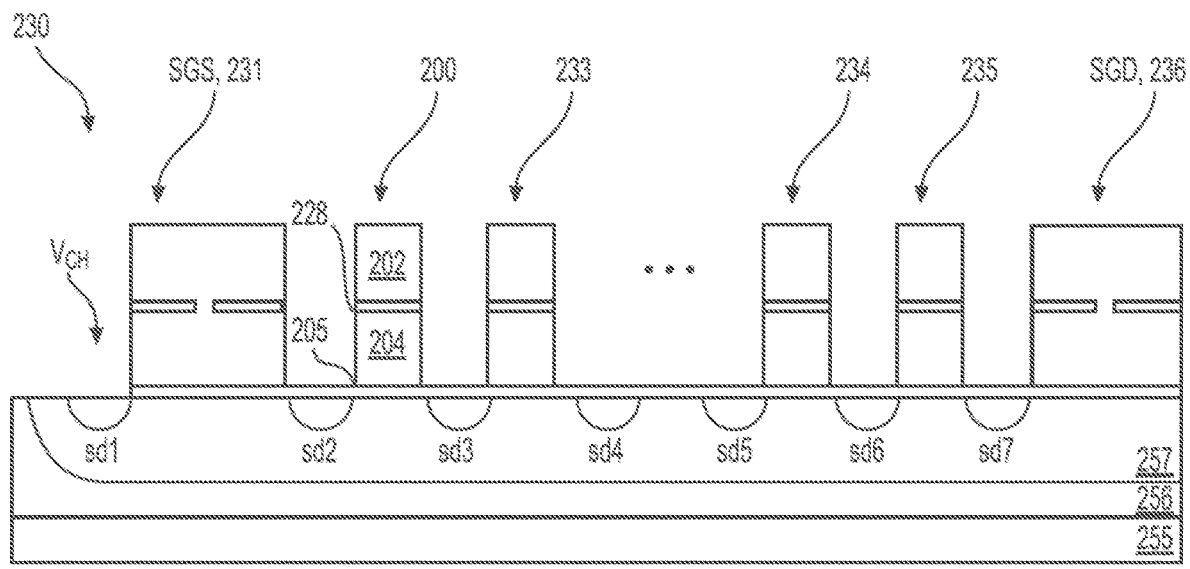
FIG. 2B – Prior Art

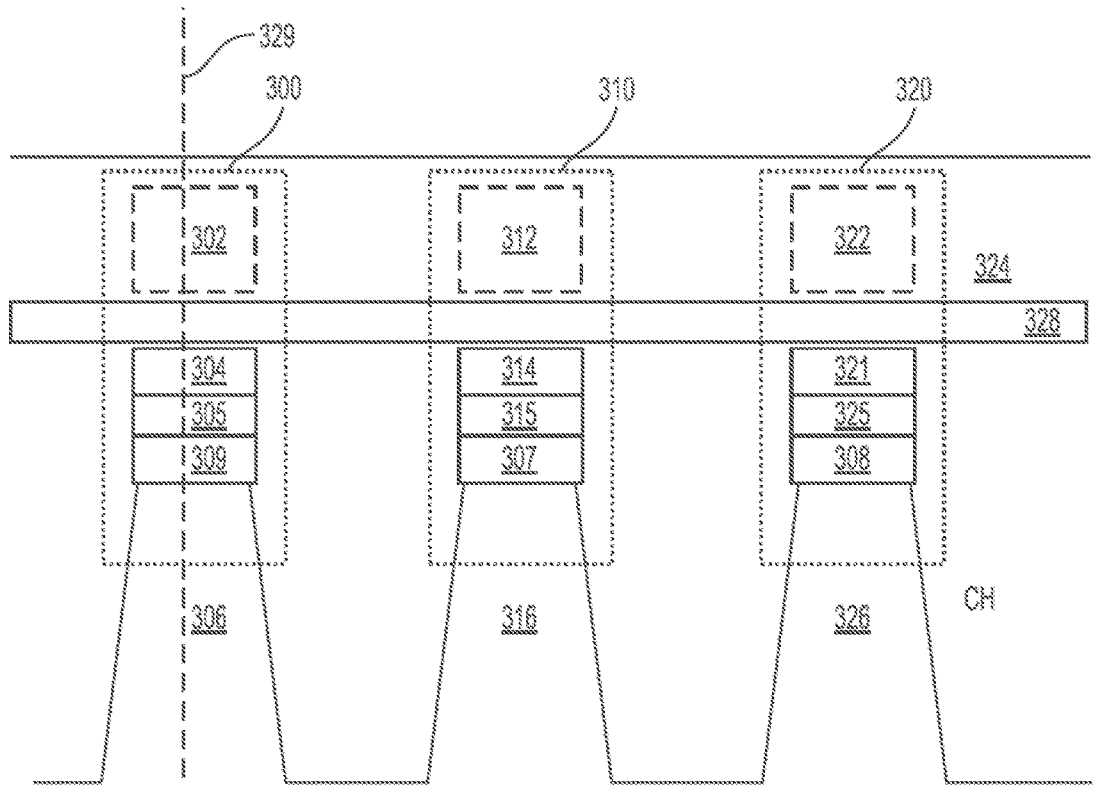
FIG. 3A – Prior Art
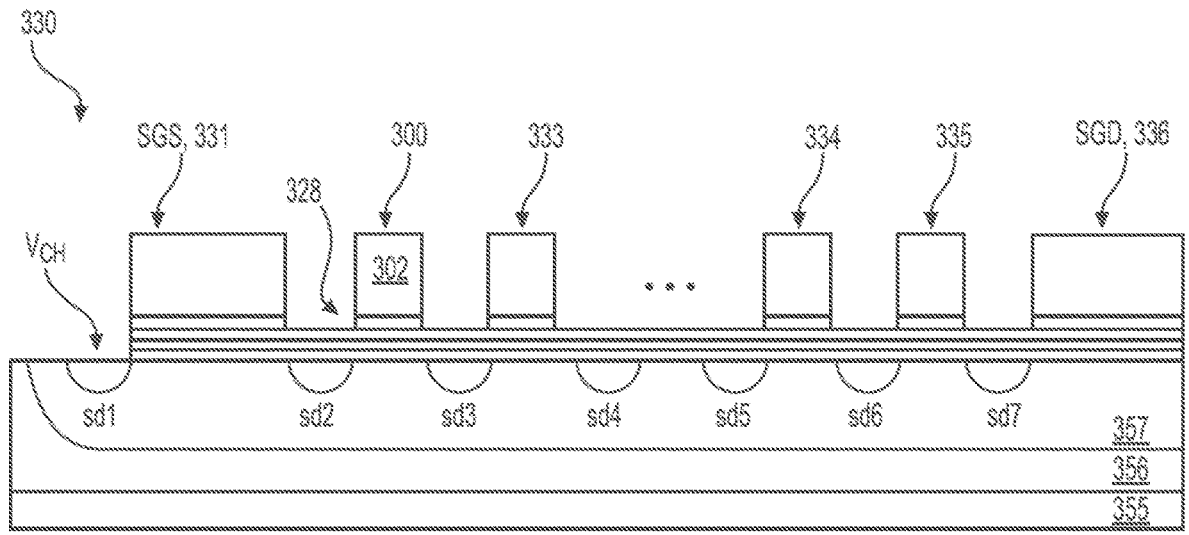
FIG. 3B – Prior Art

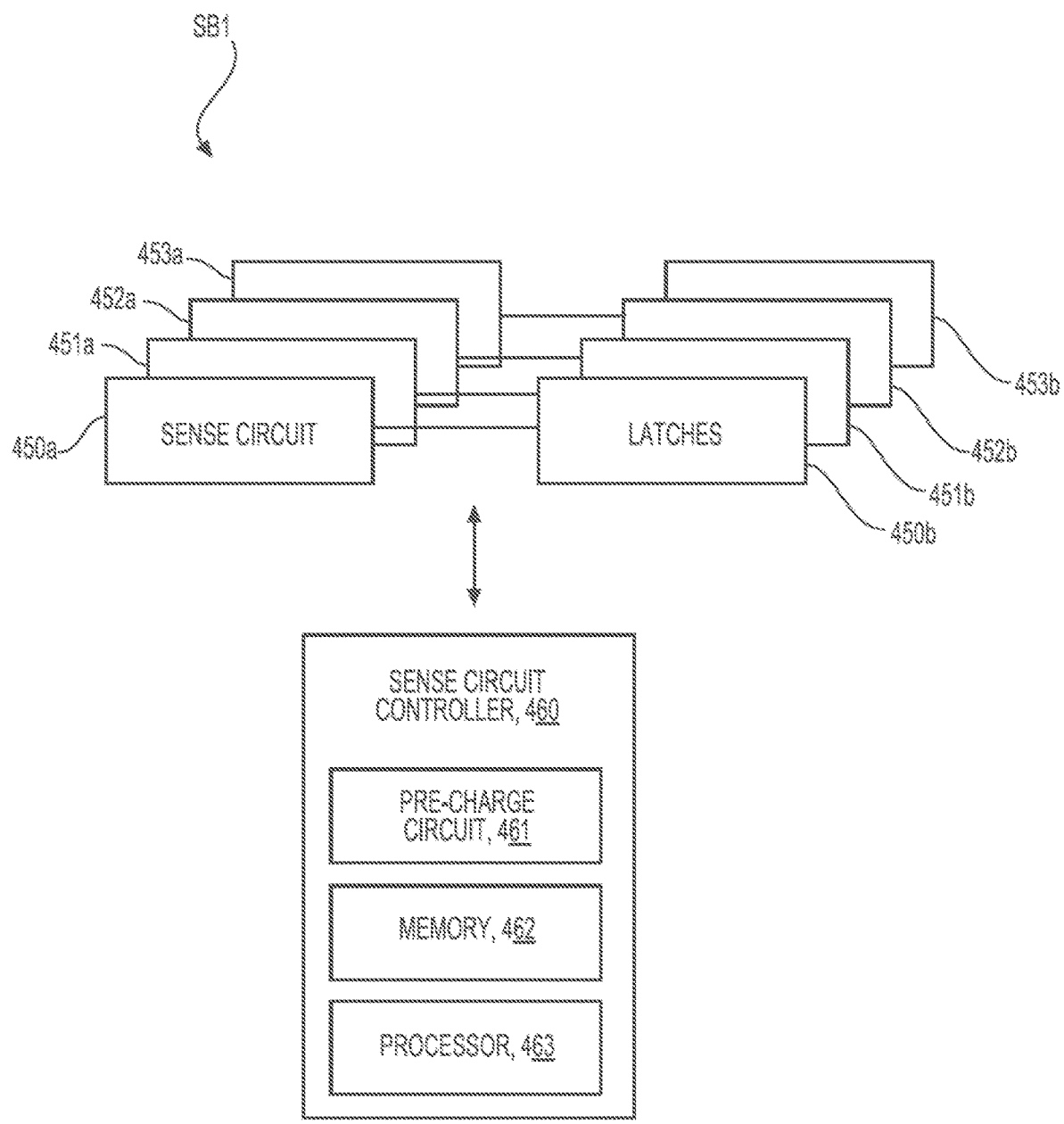
FIG. 4 – Prior Art

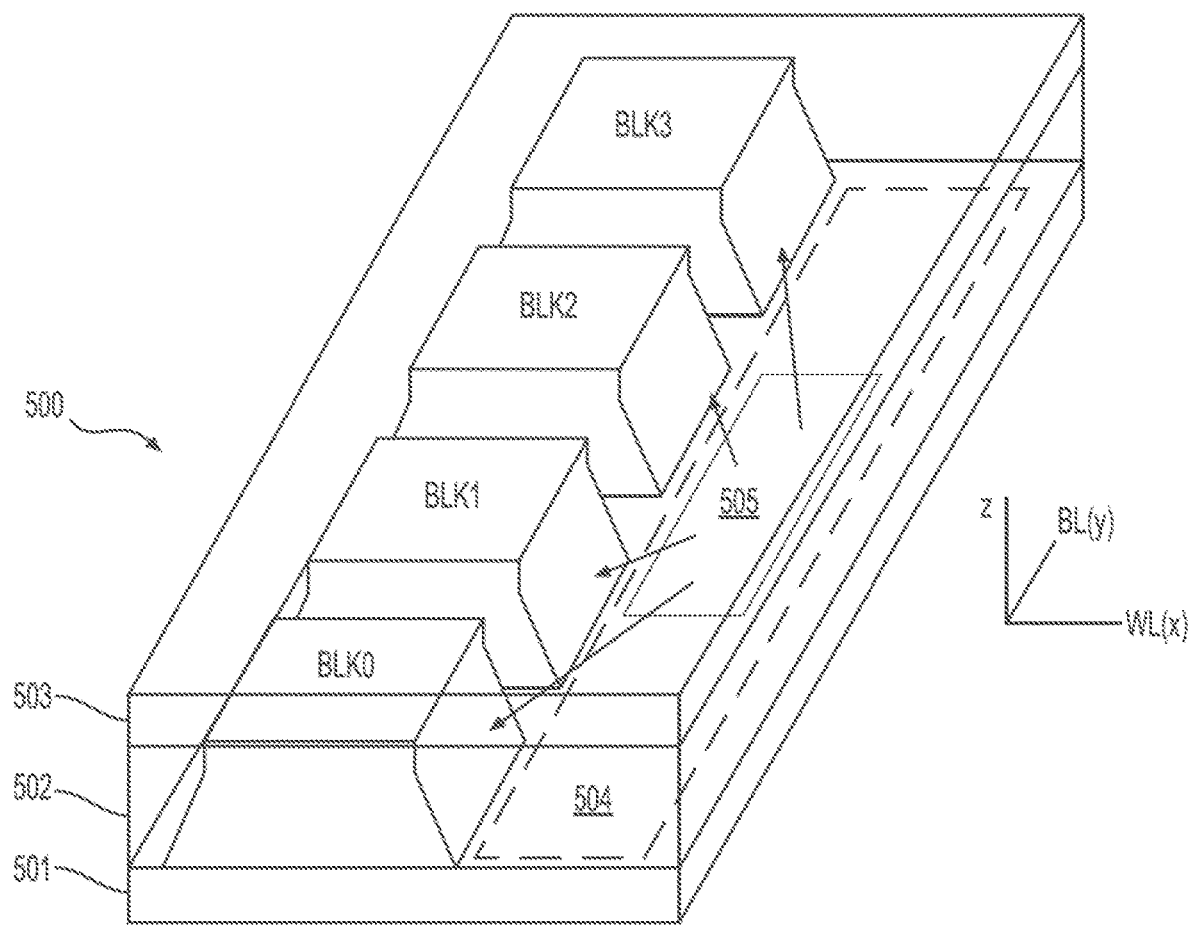
FIG. 5A – Prior Art

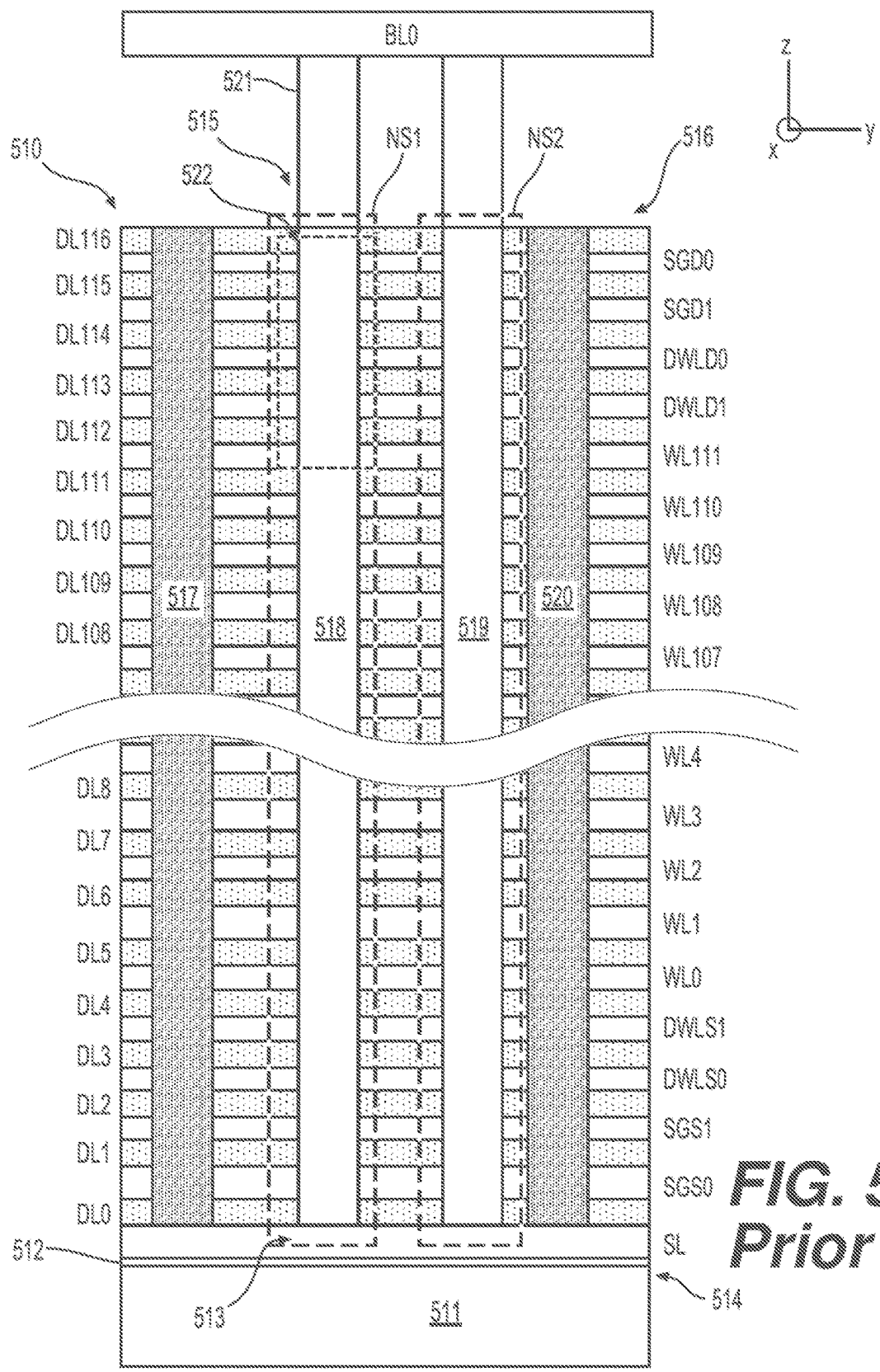
FIG. 5B - Prior Art

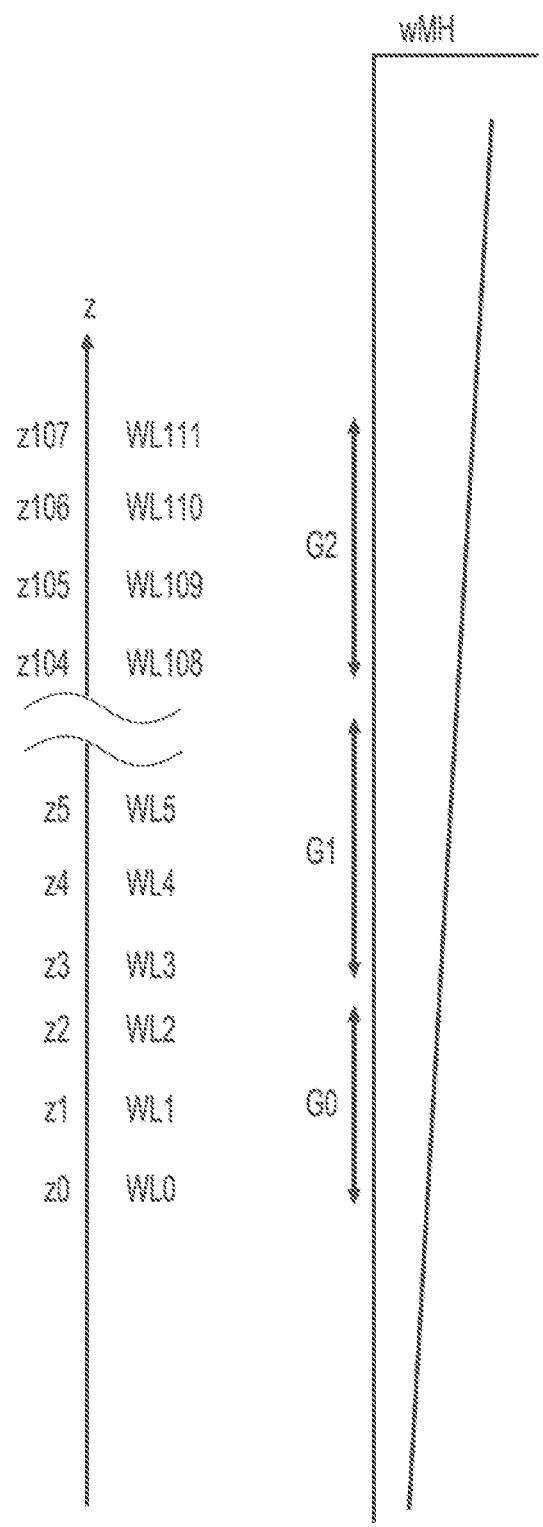
FIG. 5C – Prior Art

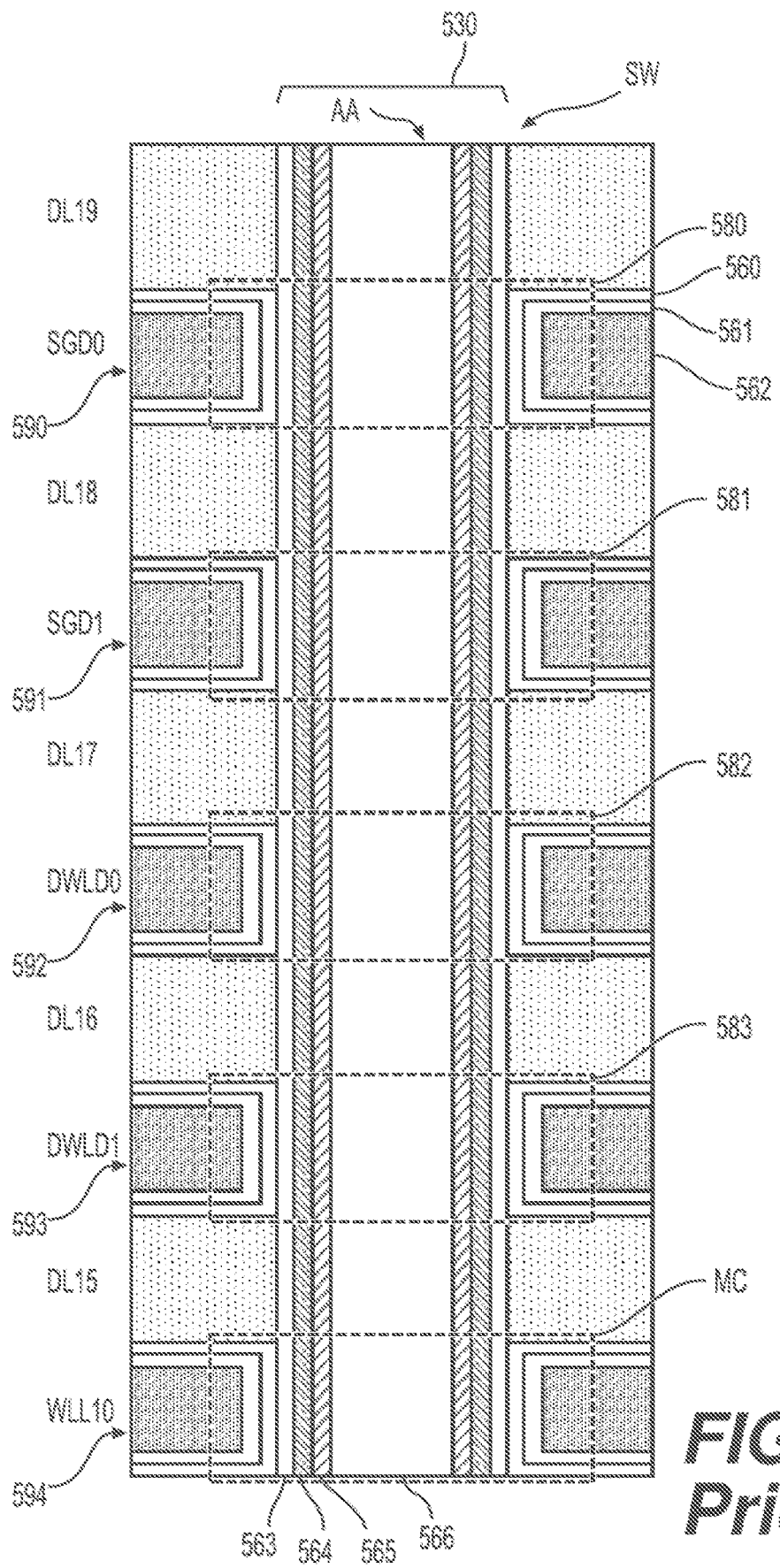
FIG. 5D – Prior Art

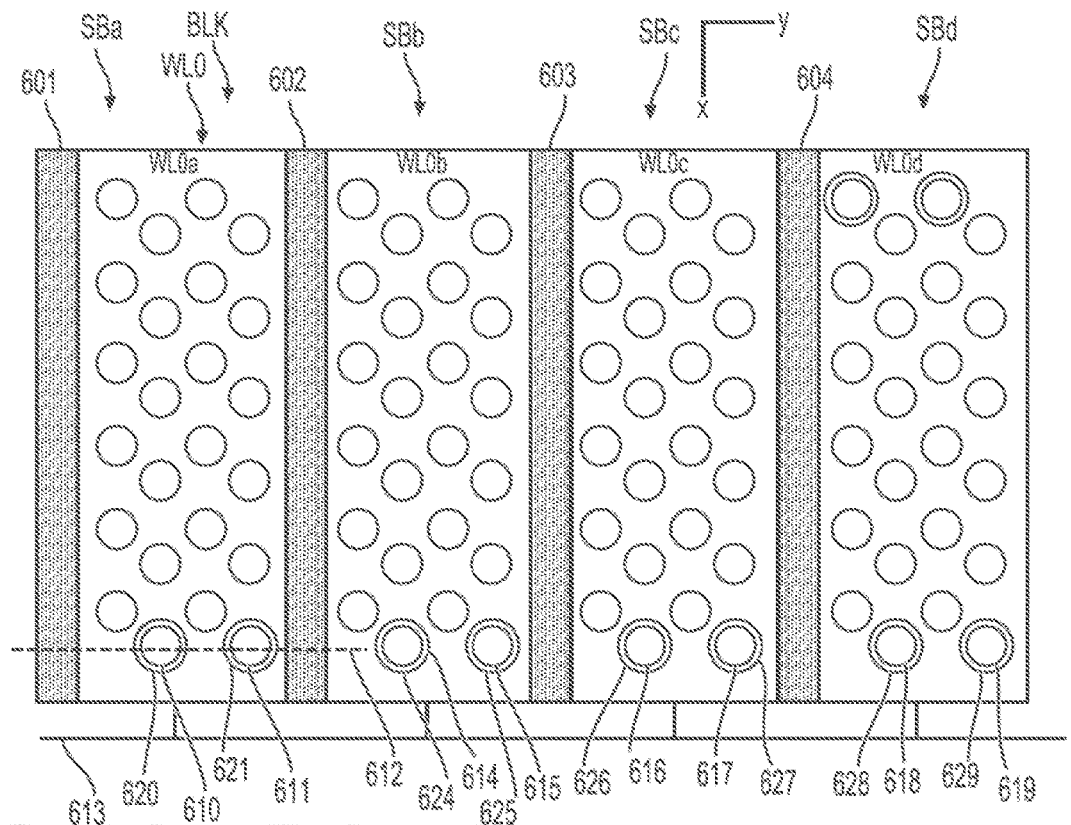
FIG. 6A – Prior Art
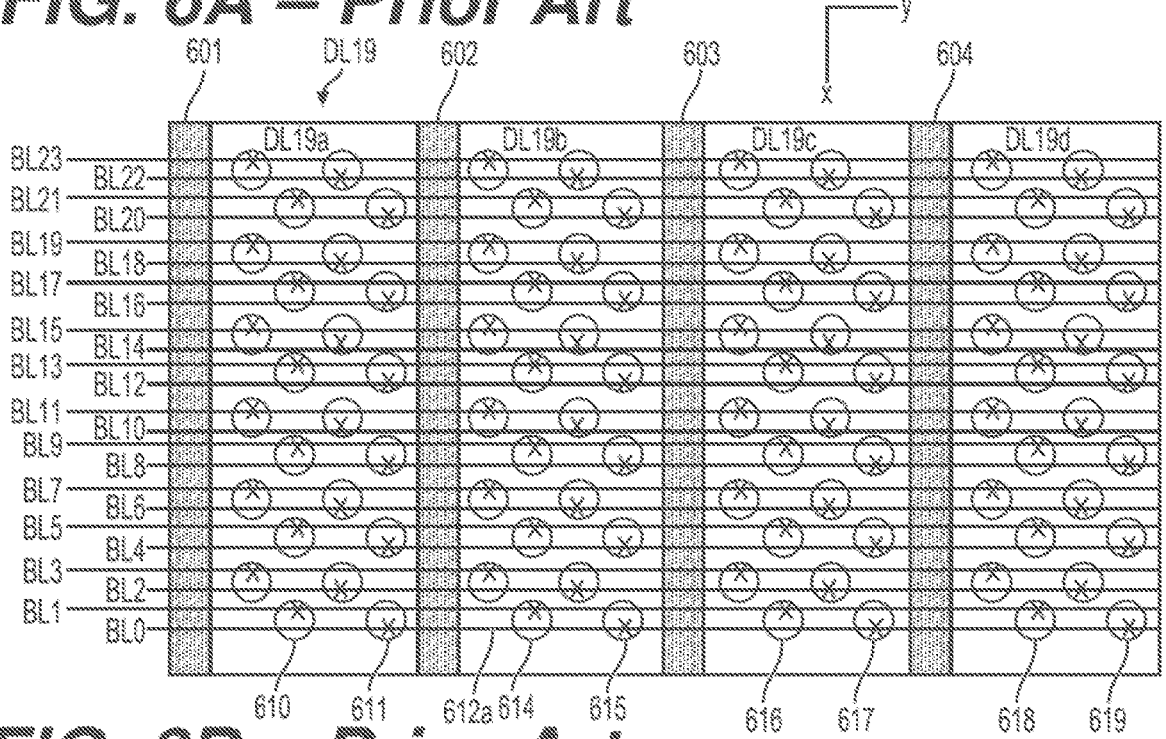
FIG. 6B – Prior Art

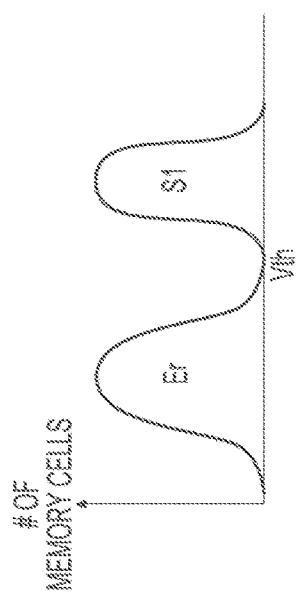
FIG. 7 – Prior Art
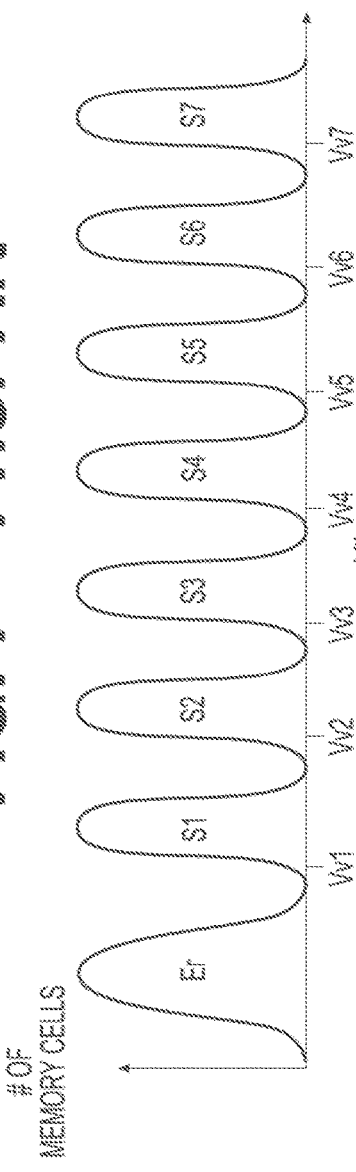
FIG. 8 – Prior Art
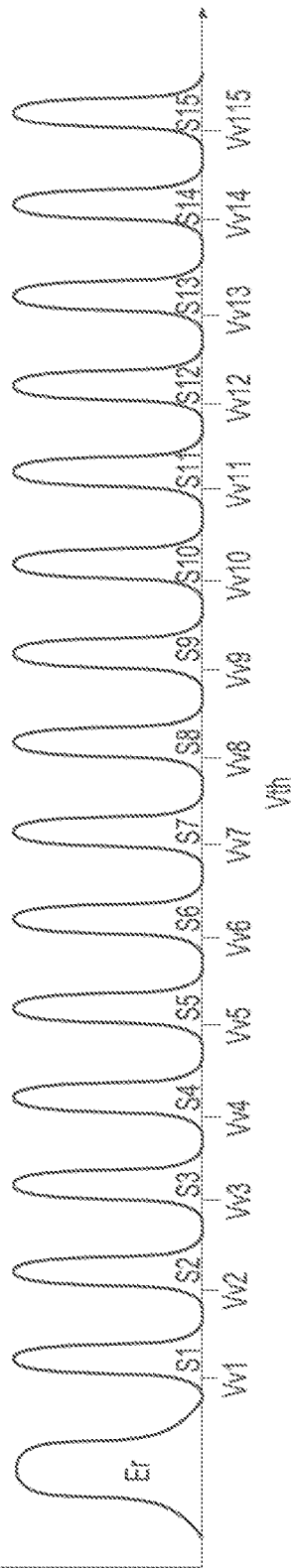
FIG. 9 – Prior Art

INTERMEDIATE RE-VERIFY FOR ACHIEVING TIGHTER THRESHOLD VOLTAGE DISTRIBUTIONS IN A MEMORY DEVICE

CROSS-REFERENCE TO RELATED APPLICATIONS

This application claims the benefit of U.S. Provisional Application No. 63/448,012, filed on Feb. 24, 2023. The entire disclosure of the application referenced above is incorporated herein by reference.

BACKGROUND

1. Field

The present disclosure is related to programming techniques for improving threshold voltage (VT) distributions in a memory device.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. A pair of example memory blocks 100, 110 are illustrated in a FIG. 1. In this example, the memory blocks 100, 110 have a two-dimensional configuration. A memory array in the chip can include many such blocks 100, 110. Each example block 100, 110 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 120. A large number of word lines varying between the technology nodes—for example, one hundred and twelve word lines (WL0-WL111) extend between the SGSs and the SGDs in a particular technology node. In some embodiments, such as in a different technology node, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory, such as of the type shown in FIGS. 2A and 2B. However, other types of non-volatile memory can also be used. As discussed in further detail below, in another example shown in FIGS. 3A and 3B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 2A illustrates a cross-sectional view of example floating gate memory cells 200, 210, 220 in NAND strings. In this Figure, a bit line or NAND string direction goes into the page, and a word line direction goes from left to right. As an example, word line 224 extends across NAND strings which include respective channel regions 206, 216 and 226. The memory cell 200 includes a control gate 202, a floating gate 204, a tunnel oxide layer 205 and the channel region 206. The memory cell 210 includes a control gate 212, a floating gate 214, a tunnel oxide layer 215 and the channel region 216. The memory cell 220 includes a control gate 222, a floating gate 221, a tunnel oxide layer 225 and the channel region 226. Each memory cell 200, 210, 220 is in a different respective NAND string. An inter-poly dielectric (IPD) layer 228 is also illustrated. The control gates 202, 212, 222 are portions of the word line. A cross-sectional view along contact line connector 229 is provided in FIG. 2B.

The control gate 202, 212, 222 wraps around the floating gate 204, 214, 221, increasing the surface contact area between the control gate 202, 212, 222 and floating gate 204, 214, 221. This results in higher IPD capacitance, leading to a higher coupling ratio which makes programming and erase easier. However, as NAND memory devices are scaled down, the spacing between neighboring cells 200, 210, 220 becomes smaller so there is almost no space for the control gate 202, 212, 222 and the IPD layer 228 between two adjacent floating gates 202, 212, 222.

As an alternative, as shown in FIGS. 3A and 3B, the flat or planar memory cell 300, 310, 320 has been developed in which the control gate 302, 312, 322 is flat or planar; that is, it does not wrap around the floating gate and its only contact with the charge storage layer 328 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 3A depicts a cross-sectional view of example charge-trapping memory cells 300, 310, 320 in NAND strings. The view is in a word line direction of memory cells 300, 310, 320 comprising a flat control gate and charge-trapping regions as a two-dimensional example of memory cells 300, 310, 320 in the memory cell array 126. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 324 extends across NAND strings which include respective channel regions 306, 316, 326. Portions of the word line provide control gates 302, 312, 322. Below the word line is an IPD layer 328, charge-trapping layers 304, 314, 321, polysilicon layers 305, 315, 325, and tunneling layers 309, 307, 308. Each charge-trapping layer 304, 314, 321 extends continuously in a respective NAND string. The flat configuration of the control gate can be made thinner than a floating gate. Additionally, the memory cells can be placed closer together.

FIG. 3B illustrates a cross-sectional view of the structure of FIG. 3A along contact line connector 329. The NAND string 330 includes an SGS transistor 331, example memory cells 300, 333, . . . 335, and an SGD transistor 336. Passageways in the IPD layer 328 in the SGS and SGD transistors 331, 336 allow the control gate layers 302 and floating gate layers to communicate. The control gate 302 and floating gate layers may be polysilicon and the tunnel oxide layer may be silicon oxide, for instance. The IPD layer 328 can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4 illustrates an example block diagram of a sense block SB1 in a memory chip. In one approach, a sense block comprises multiple sense circuits. Each sense circuit is associated with data latches. For example, the example sense circuits 450a, 451a, 452a, and 453a are associated with the data latches 450b, 451b, 452b, and 453b, respectively. In one approach, different subsets of bit lines can be sensed using different respective sense blocks. This allows the processing load which is associated with the sense circuits to be divided up and handled by a respective processor in each sense block. For example, a sense circuit controller 460 in SB1 can communicate with the set of sense circuits and latches. The sense circuit controller 460 may include a pre-charge circuit 461 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 460 may also include a pre-charge circuit 461, a memory 462 and a processor 463. The memory 462 may store code which is executable by the processor to perform the functions described herein. These functions can include reading the latches 450b, 451b, 452b, 453b which are associated with the sense circuits 450a, 451a, 452a, 453a, setting bit values in the latches and providing voltages for setting pre-charge levels in sense nodes of the sense circuits 450a, 451a, 452a, 453a. Further example details of the sense circuit controller 460 and the sense circuits 450a, 451a, 452a, 453a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

FIG. 5A is a perspective view of a set of blocks 500 in an example three-dimensional configuration. On the substrate are example blocks BLK0, BLK1, BLK2, BLK3 of memory cells (storage elements) and a peripheral area 504 with circuitry for use by the blocks BLK0, BLK1, BLK2, BLK3. For example, the circuitry can include voltage drivers 505 which can be connected to control gate layers of the blocks BLK0, BLK1, BLK2, BLK3. In one approach, control gate layers at a common height in the blocks BLK0, BLK1, BLK2, BLK3 are commonly driven. The substrate 501 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 502 of the memory device. In an upper region 503 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 5B illustrates an example cross-sectional view of a portion of one of the blocks BLK0, BLK1, BLK2, BLK3 of FIG. 5A. The block comprises a stack 510 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 510 which comprise NAND strings NS1 and NS2 are illustrated. Each NAND string encompasses a memory hole 518, 519 which is filled with materials which form memory cells adjacent to the word lines. A region 522 of the stack 510 is shown in greater detail in FIG. 5D and is discussed in further detail below.

The stack 510 includes a substrate 511, an insulating film 512 on the substrate 511, and a portion of a source line SL. NS1 has a source-end 513 at a bottom 514 of the stack and a drain-end 515 at a top 516 of the stack 510. Contact line connectors (e.g., slits, such as metal-filled slits) 517, 520 may be provided periodically across the stack 510 as interconnects which extend through the stack 510, such as to connect the source line to a particular contact line above the stack 510. The contact line connectors 517, 520 may be used during the formation of the word lines and subsequently filled with metal. A portion of a bit line BL0 is also illustrated. A conductive via 521 connects the drain-end 515 to BL0.

FIG. 5C illustrates a plot of memory hole diameter in the stack of FIG. 5B. The vertical axis is aligned with the stack of FIG. 5B and illustrates a width (wMH), e.g., diameter, of the memory holes 518 and 519. The word line layers WL0-WL111 of FIG. 5A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

FIG. 5D illustrates a close-up view of the region 522 of the stack 510 of FIG. 5B. Memory cells are formed at the different levels of the stack at the intersection of a word line layer and a memory hole. In this example, SGD transistors 580, 581 are provided above dummy memory cells 582, 583 and a data memory cell MC. A number of layers can be deposited along the sidewall (SW) of the memory hole 530 and/or within each word line layer, e.g., using atomic layer deposition. For example, each column (e.g., the pillar which is formed by the materials within a memory hole 530) can include a charge-trapping layer or film 563 such as SiN or other nitride, a tunneling layer 564, a polysilicon body or channel 565, and a dielectric core 566. A word line layer can include a blocking oxide/block high-k material 560, a metal barrier 561, and a conductive metal 562 such as Tungsten as a control gate. For example, control gates 590, 591, 592, 593, and 594 are provided. In this example, all of the layers except the metal are provided in the memory hole 530. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 530 can be filled with a plurality of annular layers comprising a blocking oxide layer, a charge trapping layer 563, a tunneling layer 564 and a channel layer. A core region of each of the memory holes 530 is filled with a body material, and the plurality of annular layers are between the core region and the word line in each of the memory holes 530.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WL0 of the stack 510 of FIG. 5B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 613. The last region of a word line layer in a block can be connected to a first region of a word line layer in a next block, in one approach. The contact line 613, in turn, is connected to a voltage driver for the word line layer. The region WL0a has example memory holes 610, 611 along a contact line 612. The region WL0b has example memory holes 614, 615. The region WL0c has example memory holes 616, 617. The region WL0d has example memory holes 618, 619. The memory holes are also shown in FIG. 6B. Each memory hole can be part of a respective NAND string. For example, the memory holes 610, 614, 616 and 618 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 620, 621 are in WL0a, memory cells 624, 625 are in WL0b, memory cells 626, 627 are in WL0c, and memory cells 628, 629 are in WL0d. These memory cells are at a common height in the stack.

Contact line connectors (e.g., slits, such as metal-filled slits) 601, 602, 603, 604 may be located between and adjacent to the edges of the regions WL0a-WL0d. The contact line connectors 601, 602, 603, 604 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 6B illustrates a top view of an example top dielectric layer DL116 of the stack of FIG. 5B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 610, 611 along a contact line 612, which is coincident with a bit line BL0. A number of bit lines extend above the memory holes and are connected to the memory holes as indicated by the "X" symbols. BL0 is connected to a set of memory holes which includes the memory holes 611, 615, 617, 619. Another example bit line BL1 is connected to a set of memory holes which includes the memory holes 610, 614, 616, 618. The contact line connectors (e.g., slits, such as metal-filled slits) 601, 602, 603, 604 from FIG. 6A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The memory cells of the memory blocks can be programmed to retain one or more bits of data in multiple data states, each of which is associated with a respective threshold voltage Vt range. For example, FIG. 7 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 8 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. FIG. 9 depicts a threshold voltage Vt distribution of a four bits per cell (QLC) storage scheme that includes sixteen total data states, namely the erased state (Er) and fifteen programmed data states (S1-S15). Other storage schemes are also available, such as two bits per cell (MLC) with four data states or five bits per cell (PLC) with thirty-two data states.

SUMMARY

An aspect of the present disclosure is related to a method of programming a memory device. The method includes the step of preparing a memory block that includes a plurality of memory cells arranged in a plurality of word lines. The method continues with the step of programming the memory cells in a selected word line of the plurality of word lines to respective ones of a plurality of programmed data states in a plurality of program loops. The plurality of program loops including verify operations. In response to any of the memory cells in the selected word line passing verify for their respective programmed data states, the method proceeds with the step of locking out that memory cell from subsequent program pulses and verify operations. For a selected programmed data state of the plurality of programmed data states, in response to a count of memory cells in the selected word line that fail the verify operation being less than a first threshold, the method continues with the steps of re-verifying all of the memory cells in the selected word line that are being programmed to the selected programmed data state and releasing all memory cells that were locked out but fail re-verify in order to allow any memory cells that mistakenly passed verify to be programmed further.

According to another aspect of the present disclosure, during the verify operations, a plurality of CELSRC drivers in the memory block are set to approximately zero Volts.

According to yet another aspect of the present disclosure, the method further includes the step of, for the selected programmed data state, ending programming to the selected programmed data state in response to a count of memory cells in the selected word line that fail the verify operation being less than a second threshold.

According to still another aspect of the present disclosure, the first threshold is greater than or equal to the second threshold.

According to a further aspect of the present disclosure, the method further includes the step of for a second programmed data state of the plurality of programmed data states, in response to a count of memory cells in the selected word line that fail the verify operation being less than the first threshold, re-verifying all of the memory cells in the selected word line that are being programmed to the second programmed data state and releasing all memory cells that were locked out but fail re-verify in order to allow any memory cells that mistakenly passed verify to be programmed further.

According to yet a further aspect of the present disclosure, the method further includes the step of, for the second programmed data state, in response to a count of memory cells in the selected word line that fail the verify operation being less than the second threshold, ending programming to the second programmed data state.

According to still a further aspect of the present disclosure, the plurality of programmed data states includes at least seven programmed data states.

According to another aspect of the present disclosure, a program pulse voltage VPGM is increased by a step size dVPGM between program loops.

Another aspect of the present disclosure is related to a memory device that includes a memory block with a plurality of memory cells arranged in a plurality of word lines. The memory device also includes control circuitry that is configured to program the memory cells in a selected word line of the plurality of word lines to respective ones of a plurality of programmed data states in a plurality of program loops, which include verify operations. The control circuitry is further configured to lock out any of the memory cells in the selected word line from subsequent program pulses and verify operations in response to any of that memory cell passing verify for its programmed data state. For a selected programmed data state of the plurality of programmed data states, the control circuitry is further configured to re-verify all of the memory cells in the selected word line that are being programmed to the selected programmed data state and release all memory cells that were locked out but fail re-verify in order to allow any memory cells that mistakenly passed verify to be programmed further in response to a count of memory cells in the selected word line that fail the verify operation being less than a first threshold.

According to another aspect of the present disclosure, during the verify operations, the control circuitry sets a plurality of CELSRC drivers in the memory block to approximately zero Volts.

According to yet another aspect of the present disclosure, the control circuitry is further configured to, for the selected programmed data state, end programming to the selected programmed data state in response to a count of memory cells in the selected word line that fail the verify operation being less than a second threshold.

According to still another aspect of the present disclosure, the first threshold is greater than the second threshold.

According to a further aspect of the present disclosure, for a second programmed data state of the plurality of programmed data states, the control circuitry is further configured to re-verify all of the memory cells in the selected word line that are being programmed to the second programmed data state and release all memory cells that were locked out but fail re-verify in order to allow any memory cells that mistakenly passed verify to be programmed further in response to a count of memory cells in the selected word line that fail the verify operation being less than the first threshold.

According to yet a further aspect of the present disclosure, for the second programmed data state, the control circuitry is configured to end programming to the second programmed data state in response to a count of memory cells in the selected word line that fail the verify operation being less than the second threshold.

According to still a further aspect of the present disclosure, the plurality of programmed data states includes at least seven programmed data states.

According to another aspect of the present disclosure, the control circuitry is further configured to increase a program pulse voltage VPGM by a step size dVPGM between program loops.

Yet another aspect of the present disclosure is related to an apparatus that includes a memory block with a plurality of memory cells arranged in a plurality of word lines. The memory device also includes a programming means for programming the memory cells in a selected word line of the plurality of word lines to respective ones of a plurality of programmed data states in a plurality of program loops. The plurality of program loops include verify operations. The programming means is further configured to lock out that memory cell from subsequent program pulses and verify operations in response to any of the memory cells in the selected word line passing verify for their respective programmed data states. For each programmed data state of the plurality of programmed data states, the programming means is also configured to re-verify all of the memory cells in the selected word line that are being programmed to that programmed data state and release all memory cells that were locked out but fail re-verify in order to allow any memory cells that mistakenly passed verify to be programmed further in response to a count of memory cells in the selected word line that fail the verify operation being less than a first threshold.

According to another aspect of the present disclosure, the programming means is further configured to end programming to the respective programmed data state in response to a count of memory cells in the selected word line that fail the verify operation being less than a second threshold for each of the plurality of programmed data states.

According to yet another aspect of the present disclosure, the first threshold is greater than the second threshold.

According to still another aspect of the present disclosure, the plurality of programmed data states includes at least seven programmed data states.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 1 depicts blocks of memory cells in an example two-dimensional configuration of a memory array:

FIG. 2A and FIG. 2B depict cross-sectional views of example floating gate memory cells in NAND strings:

FIG. 3A and FIG. 3B depict cross-sectional views of example charge-trapping memory cells in NAND strings:

FIG. 4 depicts an example block diagram of a sense block SB1:

FIG. 5A is a perspective view of a set of blocks in an example three-dimensional configuration of a memory array:

FIG. 5B depicts an example cross-sectional view of a portion of one of the blocks of FIG. 5A:

FIG. 5C depicts a plot of memory hole diameter of the stack of FIG. 5B:

FIG. 5D depicts a close-up view of region 522 of the stack of FIG. 5B:

FIG. 6A depicts a top view of an example word line layer WL0 of the stack of FIG. 5B:

FIG. 6B depicts a top view of an example top dielectric layer DL116 of the stack of FIG. 5B:

FIG. 7 depicts a threshold voltage distribution of a page of memory cells programmed to one bit per memory cell (SLC):

FIG. 8 depicts a threshold voltage distribution of a page of memory cells programmed to three bits per memory cell (TLC):

FIG. 9 depicts a threshold voltage distribution of a page of memory cells programmed to four bits per memory cell (QLC):

DESCRIPTION OF THE ENABLING EMBODIMENTS

The present disclosure is related to programming techniques that improved the threshold voltage (Vt) margin of the programmed memory cells in a selected word line, thereby improving the reliability of the data programmed therein. According to these techniques, for each of the programmed data states, a plurality of program loops are performed on the selected word line, and the memory cells that pass verify are locked out. Then, in response to a predetermined number of memory cells in the selected word line passing verify, all of the locked out memory cells are unlocked. This allows any memory cells that mistakenly passed verify due to a phenomenon sometimes known as CELSRC bounce to be recaptured and programmed further. Programming proceeds for a plurality of additional program loops until a programming to the respective data state is completed. This process is repeated until all programmed data states are completed.

Figure 10A:
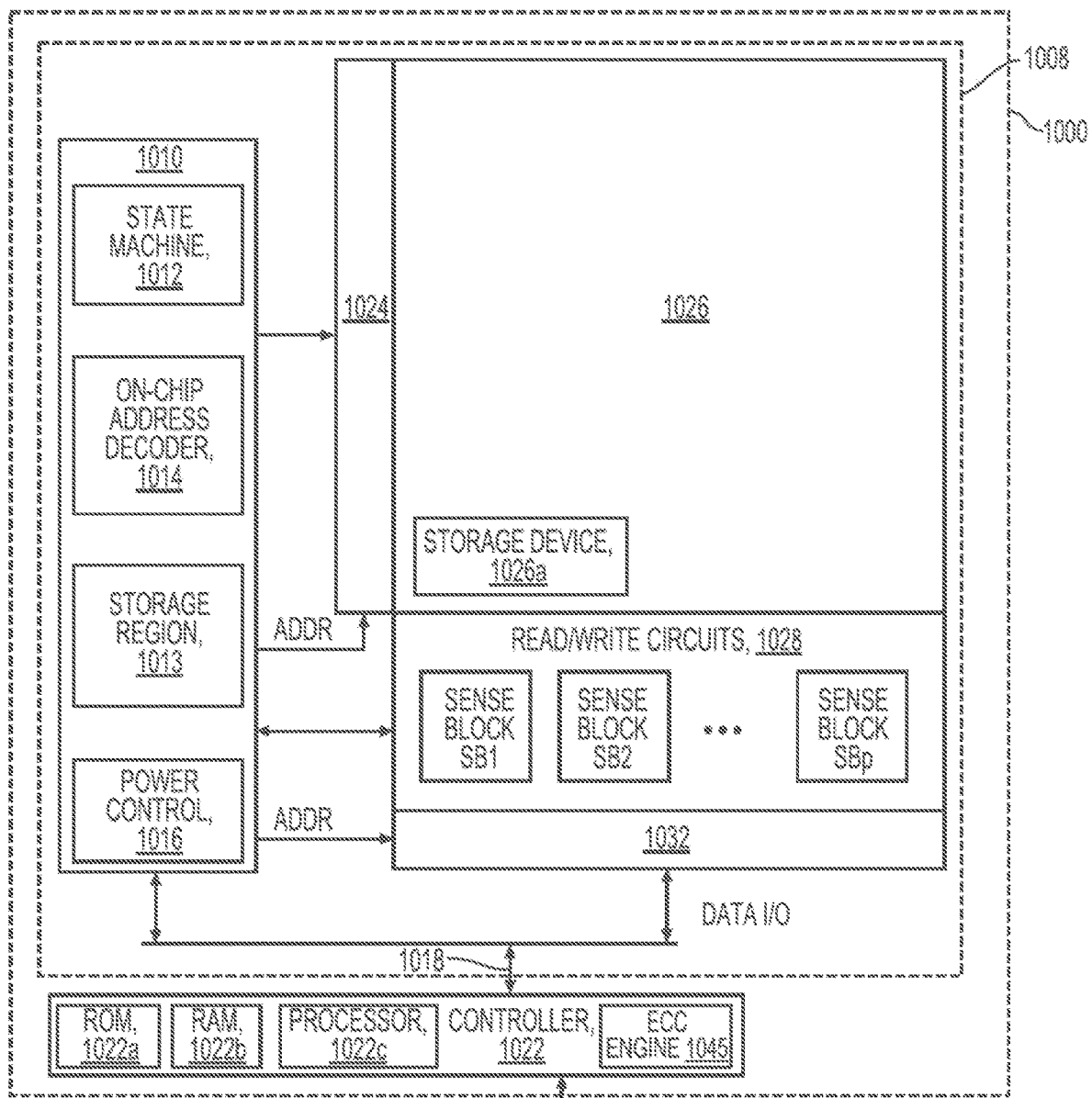
FIG. 10A is a block diagram of an example memory device.

FIG. 10A is a block diagram of an example memory device 1000 that is configured to operate according to the programming techniques of the present disclosure. The memory die 1008 includes a memory structure 1026 of memory cells, such as an array of memory cells, control circuitry 1010, and read/write circuits 1028. The memory structure 1026 is addressable by word lines via a row decoder 1024 and by bit lines via a column decoder 1032. The read/write circuits 1028 include multiple sense blocks SB1, SB2, . . . SBp (sensing circuitry) and allow a page of memory cells to be read or programmed in parallel. Typically, a controller 1022 is included in the same memory device 1000 (e.g., a removable storage card) as the one or more memory die 1008. Commands and data are transferred between the host 1040 and controller 1022 via a data bus 1020, and between the controller and the one or more memory die 1008 via lines 1018.

The memory structure 1026 can be two-dimensional or three-dimensional. The memory structure 1026 may comprise one or more array of memory cells including a three-dimensional array. The memory structure 1026 may comprise a monolithic three-dimensional memory structure in which multiple memory levels are formed above (and not in) a single substrate, such as a wafer, with no intervening substrates. The memory structure 1026 may comprise any type of non-volatile memory that is monolithically formed in one or more physical levels of arrays of memory cells having an active area disposed above a silicon substrate. The memory structure 1026 may be in a non-volatile memory device having circuitry associated with the operation of the memory cells, whether the associated circuitry is above or within the substrate.

The control circuitry 1010 cooperates with the read/write circuits 1028 to perform memory operations on the memory structure 1026, and includes a state machine 1012, an on-chip address decoder 1014, a power control module 1016, and a temperature sensor 1017. The state machine 1012 provides chip-level control of memory operations. As discussed in further detail below and illustrated briefly in FIG. 10C, the control circuitry 1010 is configured to program the memory cells of a word line according to a programming technique where the memory cells that initially pass verify for their respective intended data state are re-verified to capture any memory cells that may have mistakenly passed verify due to CELSRC bounce. The programming techniques include, at step 1060, performing a programming (program-verify) operation. Any memory cells that pass verify are locked out from programming and from verify during subsequent program loops. At decision step 1062, it is determined if the number of memory cells that failed verify for one of the programmed data states is less than a first threshold, i.e., a BS-PS threshold. If the answer at decision step 1062 is "no," then the process returns to step 1060. If the answer at decision step 1062 is "yes," then at step 1064, all of the memory cells being programmed to that programmed data state, including the ones that were locked out at step 1060, are re-verified. Any memory cells that fail re-verify are unlocked for further programming. At step 1066, programming continues for the programmed data state until completed. The process then repeats for each of the programmed data states until programming of the selected word line is completed.

A storage region 1013 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 1014 provides an address interface that is used by the host or a memory controller to determine the hardware address used by the decoders 1024 and 1032. The power control module 1016 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 1026, can be thought of as at least one control circuit which is configured to perform the actions described herein. For example, a control circuit may include any one of, or a combination of, control circuitry 1010, state machine 1012, decoders 1014/1032, power control module 1016, sense blocks SBb, SB2, . . . , SBp, read/write circuits 1028, controller 1022, and so forth.

Figure 10B:
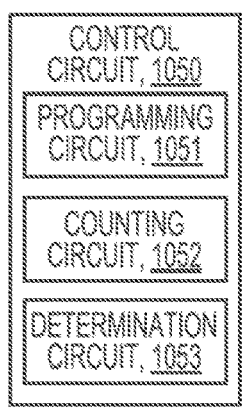
FIG. 10B is a block diagram of an example control circuit.
Figure 10C:
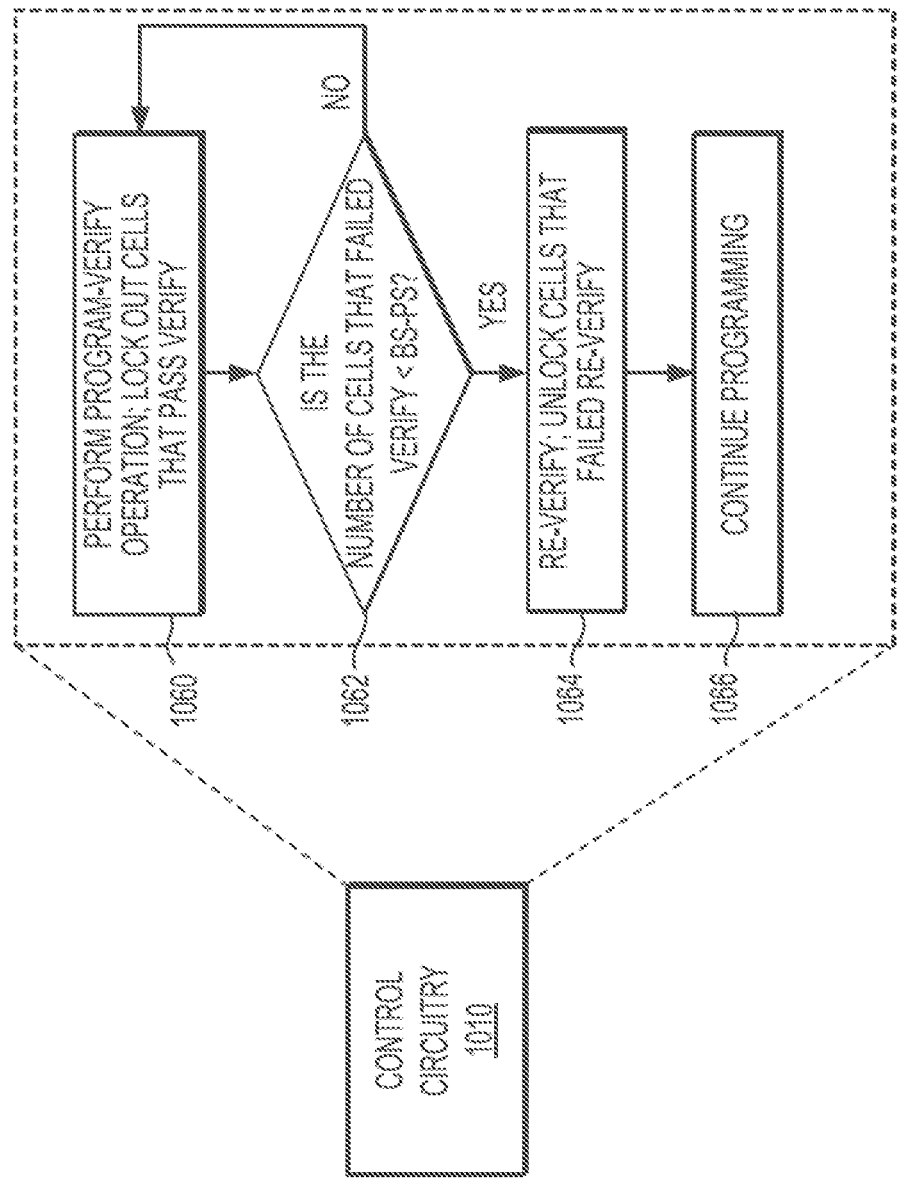
FIG. 10C is another block diagram of an example control circuit.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states: the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed. For example, FIG. 10B is a block diagram of an example control circuit 1050 which comprises a programming circuit 1051, a counting circuit 1052, and a determination circuit 1053.

The off-chip controller 1022 may comprise a processor 1022c, storage devices (memory) such as ROM 1022a and RAM 1022b and an error-correction code (ECC) engine 1045. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 1022a, 1022b comprise, code such as a set of instructions, and the processor 1022c is operable to execute the set of instructions to provide the functionality described herein. Alternately or additionally, the processor 1022c can access code from a storage device 1026a of the memory structure 1026, such as a reserved area of memory cells in one or more word lines. For example, code can be used by the controller 1022 to access the memory structure 1026 such as for programming, read and erase operations. The code can include boot code and control code (e.g., set of instructions). The boot code is software that initializes the controller 1022 during a booting or startup process and enables the controller 1022 to access the memory structure 1026. The code can be used by the controller 1022 to control one or more memory structures 1026. Upon being powered up, the processor 1022c fetches the boot code from the ROM 1022a or storage device 1026a for execution, and the boot code initializes the system components and loads the control code into the RAM 1022b. Once the control code is loaded into the RAM 1022b, it is executed by the processor 1022c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 11:
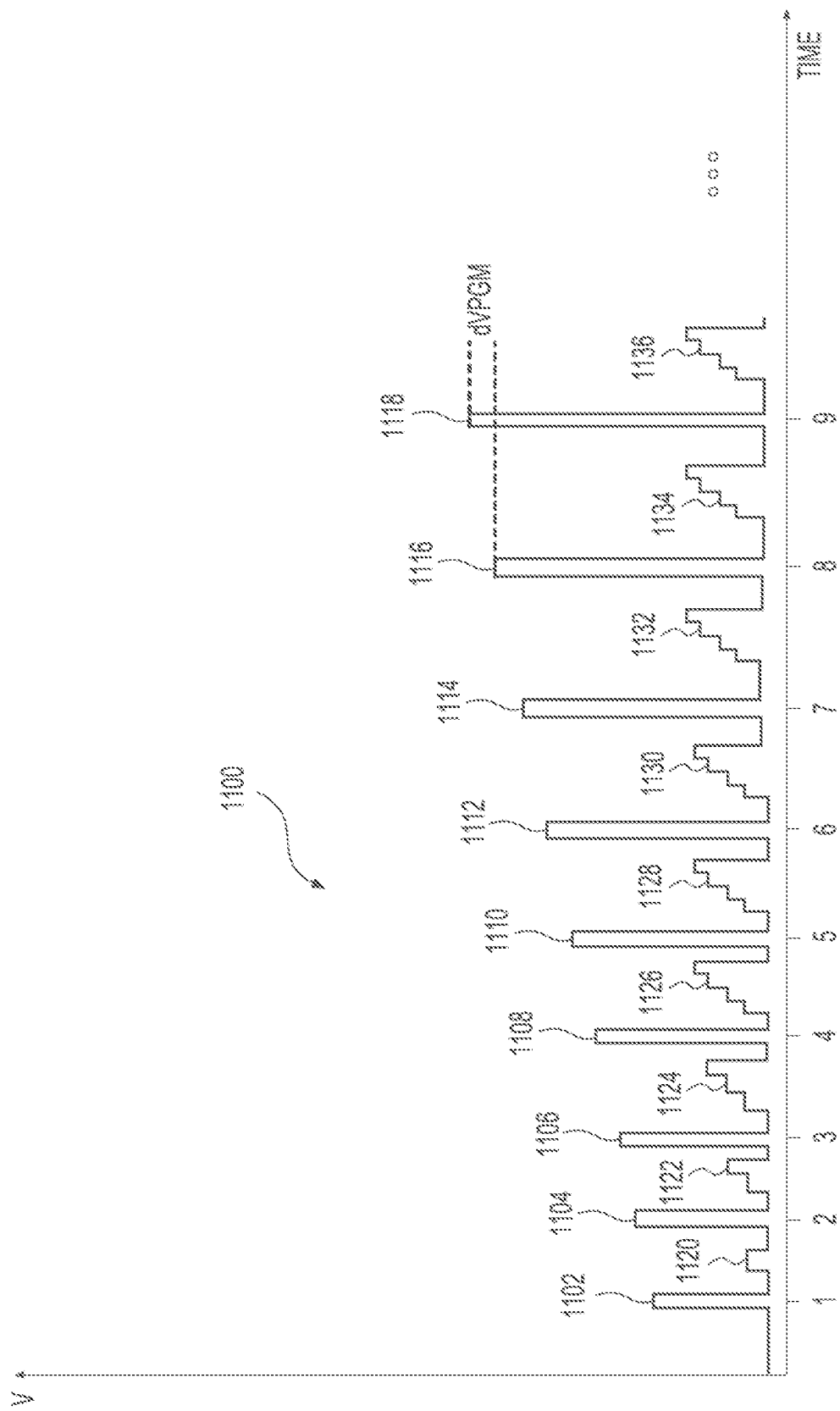
FIG. 11 is a voltage waveform of the voltage applied to a control gate of a selected word line during a programming operation.

Programming the memory cells occurs on a word line-by-word line basis from one side of the memory block towards an opposite side of the memory block. Typically, programming the memory cells of a selected word line to retain multiple bits per memory cell (for example, MLC, TLC, or QLC) starts with the memory cells being in the erased data state and includes a plurality of program loops, each of which includes both a programming pulse and a verify operation. FIG. 11 depicts a waveform 1100 of the voltages applied to a selected word line during an example memory cell programming operation for programming the memory cells of the selected word line to a greater number of bits per memory cell (e.g., TLC or QLC). As depicted, each program loop includes a programming pulse VPGM and one or more verify pulses, depending on which data states are being programmed in a particular program loop. A square waveform is depicted for each pulse for simplicity: however, other shapes are possible, such as a multilevel shape or a ramped shape.

Incremental Step Pulse Programming (ISPP) is used in this example pulse train, which means that the VPGM pulse amplitude steps up, or increases, in each successive program loop. More specifically, the pulse train includes VPGM pulses that increase stepwise in amplitude with each successive program loop by a fixed program voltage step size (dVPGM). A new pulse train starts with a starting voltage VPGMU and ends at a final VPGM pulse level, which does not exceed a maximum allowed level. The example pulse train 1100 includes a series of VPGM pulses 1101-1115 that are applied to a control gate of the selected word line to program the memory cells of that word line. As illustrated, the VPGM pulses 1101-1115 increase in amplitude by the program voltage step size dVPGM between pulses.

One or more verify voltage pulses 1116-1129 are provided after each VPGM pulse as an example, based on the target data states which are being verified in the program loop. The verify voltages correspond with voltages Vv1-Vv7 shown in FIG. 8 or Vv1-Vv15 shown in FIG. 9. Concurrent with the application of the verify voltages, a sensing operation can determine whether a particular memory cell in the selected word line has a threshold voltage Vt above the verify voltage associated with its intended data state by sensing a current through the memory cell. If the current is relatively high during sensing, this indicates that the memory cell is in a conductive state, such that its threshold voltage Vt is less than the verify voltage. If the current is relatively low during sensing, this indicates that the memory cell is in a non-conductive state, such that its threshold voltage Vt is above the verify voltage. If the memory cell passes verify, programming of that memory cell is completed and further programming of that memory cell is inhibited (or locked out) for all remaining program loops by applying an inhibit voltage to a bit line coupled with the memory cell concurrent with the VPGM pulse and by skipping verify for those memory cells. Programming proceeds until all memory cells of the selected word line pass verify for their intended data states, in which case, programming passes, or until a predetermined maximum number of program loops is exceeded, in which case, programming fails. In some embodiments, the memory cells of a word line can be divided into a series of string groups, or simply strings, that can be programmed independently of one another, and programming can commence from one string to another across the word line before proceeding to the next word line in the memory block.

The memory cells can be erased on a block or sub-block level by applying an erase pulse to the channels to draw electrons out of the charge trapping layers of the memory cells and thereby reduce the threshold voltages of the memory cells. Similar to a programming operation, an erasing operation can also include one or more loops, each with an erase pulse and a verify operation. Erase is completed when the threshold voltages of an adequate number of memory cells are below a targeted erase-verify voltage, which could be 0 V or a negative voltage in some embodiments.

Figure 12:
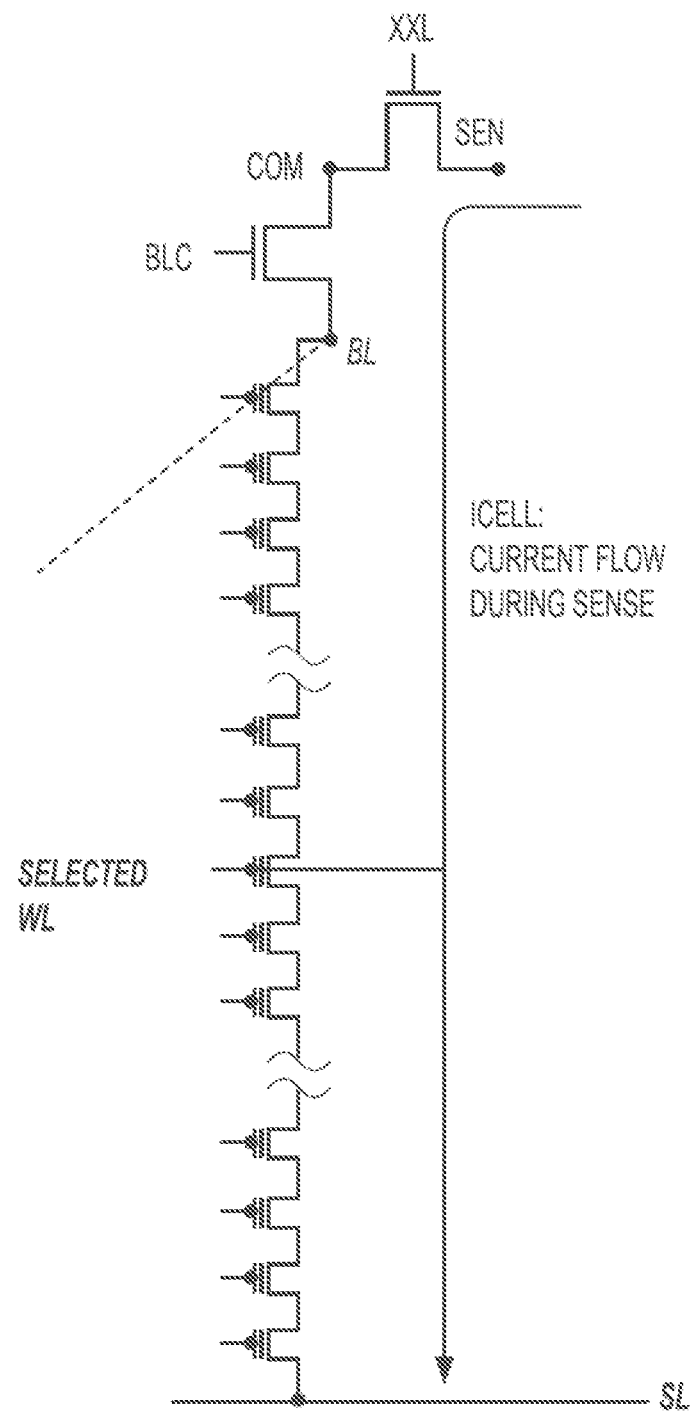
FIG. 12 is a schematic view of a string during a sensing operation and illustrating a direction of current flow through the string.
Figure 13:
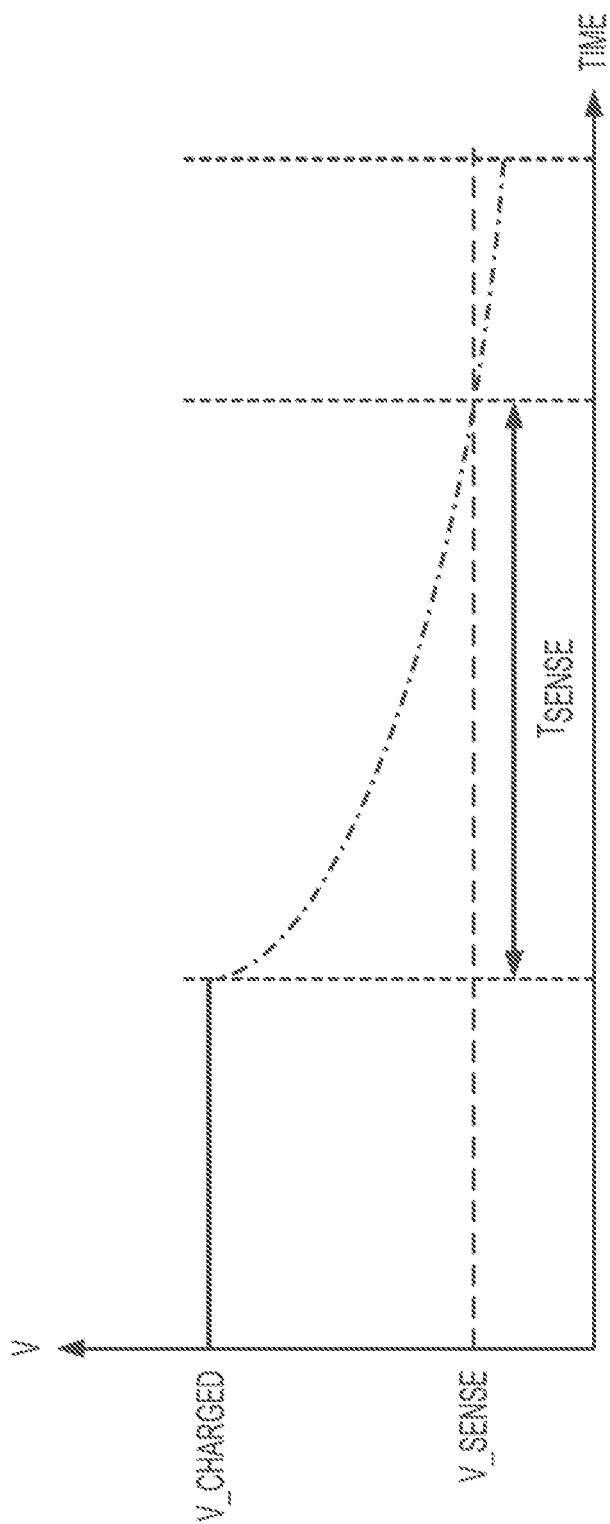
FIG. 13 is a plot illustrating the voltage in a sense node versus time during a sensing operation.

Referring now to FIGS. 12 and 13, during a sensing operation (verify or read), a sense node SEN on the drain side of the memory block is charged to a predetermined charged voltage. Simultaneously, all of the memory cells of the NAND string except the memory cell of the selected word line are turned on by a pass voltage VREAD. A reference voltage (e.g., Vv1-Vv7 in FIG. 8 or Vv1-Vv15 in FIG. 9) is applied to a control gate of the selected word line. The sense node SEN is then discharged through the string and, since all of the memory cells except the one of the selected word line are turned on, the discharge current Icell through the NAND string is largely dictated by the threshold voltage of the memory cell being sensed. At a discharge time T_sense, a voltage on the SEN node is sensed by the sensing circuitry and compared to V_sense, which is the threshold voltage Vt of the AVPGM sensing transistor. If the threshold voltage Vt of the memory cell being sensed is higher than the reference voltage, then the memory cell is "off" and conducts a very small/negligible current resulting in only a small discharge of SEN node voltage, thereby maintaining higher voltage on the SEN node compared to V_sense. If the threshold voltage Vt of the memory cell being sensed is lower than the reference voltage, then the memory cell is "on" and conducts a larger discharging current resulting in the SEN node bias being lower than V_sense.

Figure 14:
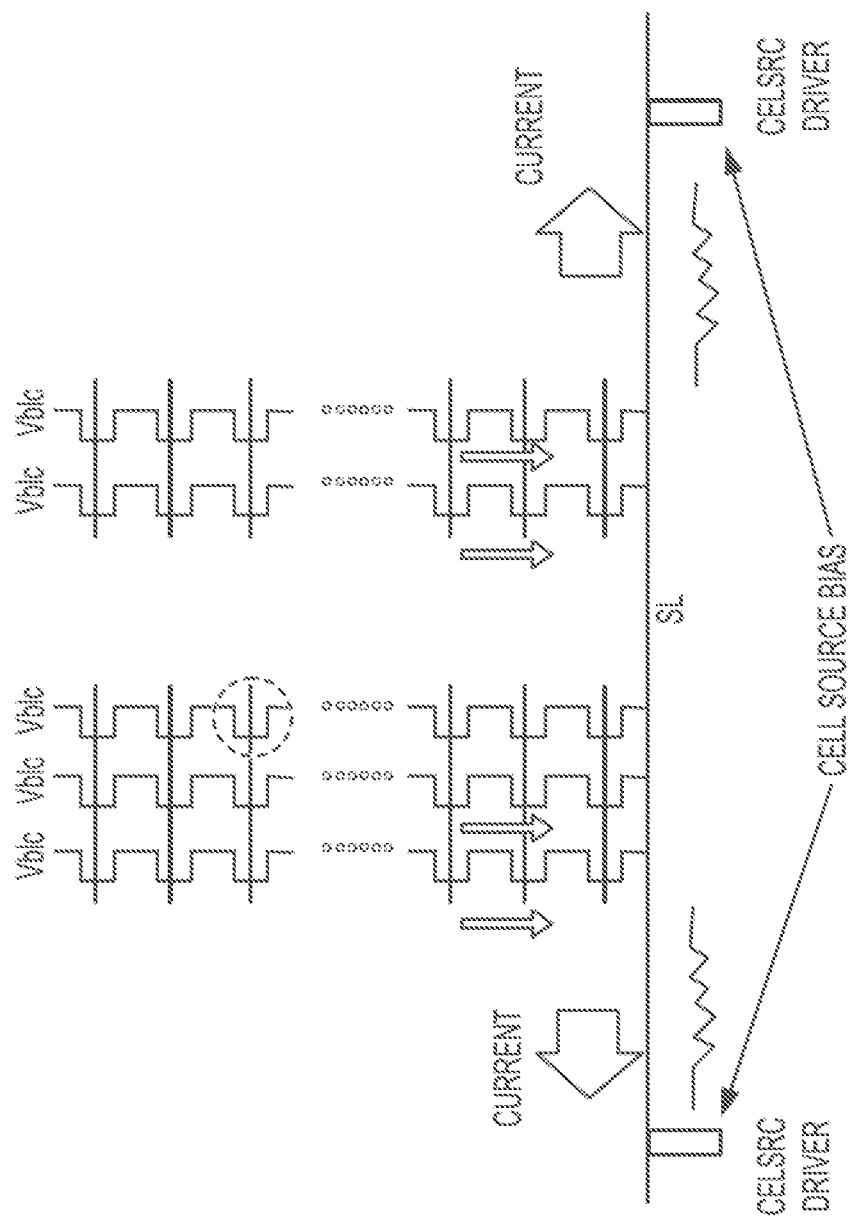
FIG. 14 is a schematic view of a plurality of strings in a memory block during a sensing operation.

Turning now to FIG. 14, the memory block depicted therein has a plurality of NAND strings, a source line SL that is common to those NAND strings, and a plurality of common source line (CELSRC) drivers that are spaced apart from one another with a plurality of NAND strings being connected to the source line SL between CELSRC drivers. During a sensing operation, current flows in the direction indicated with the arrows from the bit lines at a bit line voltage Vblc on the drain side of the memory block, through the strings, into the source line SL, and ultimately to the CELSRC drivers. The combination of this current and internal resistance within the source line SL causes the effective voltage at the bases of the NAND strings (where the NAND strings meet the source line SL) to vary from one another. One approach to reducing the variation of the voltages at the bases of the NAND strings across the memory block is to regulate the voltage in the source line SL. But, such a voltage regulation would be difficult if the absolute value of the voltage is very small or near to zero. So, it would have to be done by applying a non-zero CELSRC bias voltage to the CELSRC drivers. One problem with this approach is the time that is needed to ramp the CELSRC drivers to the CELSRC bias voltage, combined with the necessity of several additional operations when a positive CELSRC bias is used, reduces the performance of the memory device during program-verify and read operations.

Setting the CELSRC drivers to zero Volts (0 V) may eliminate the time required to increase the CELSRC drivers to the CELSRC bias voltage and it might also eliminate the necessity of several additional operations, but may result in a phenomenon that is sometimes known as "CELSRC bounce." CELSRC bounce is a function of current Icell with a higher current causing a higher CELSRC bounce, which in turn causes a sensing error that can produce increased threshold voltage distribution widths for one or more of the programmed data states. In other words, some memory cells may pass verify before their threshold voltages reach the appropriate verify voltage. In some cases, CELSRC bounce can result in a Vt margin loss of 60 mV when programming to TLC and 120 mV when programming to QLC.

Figure 15:
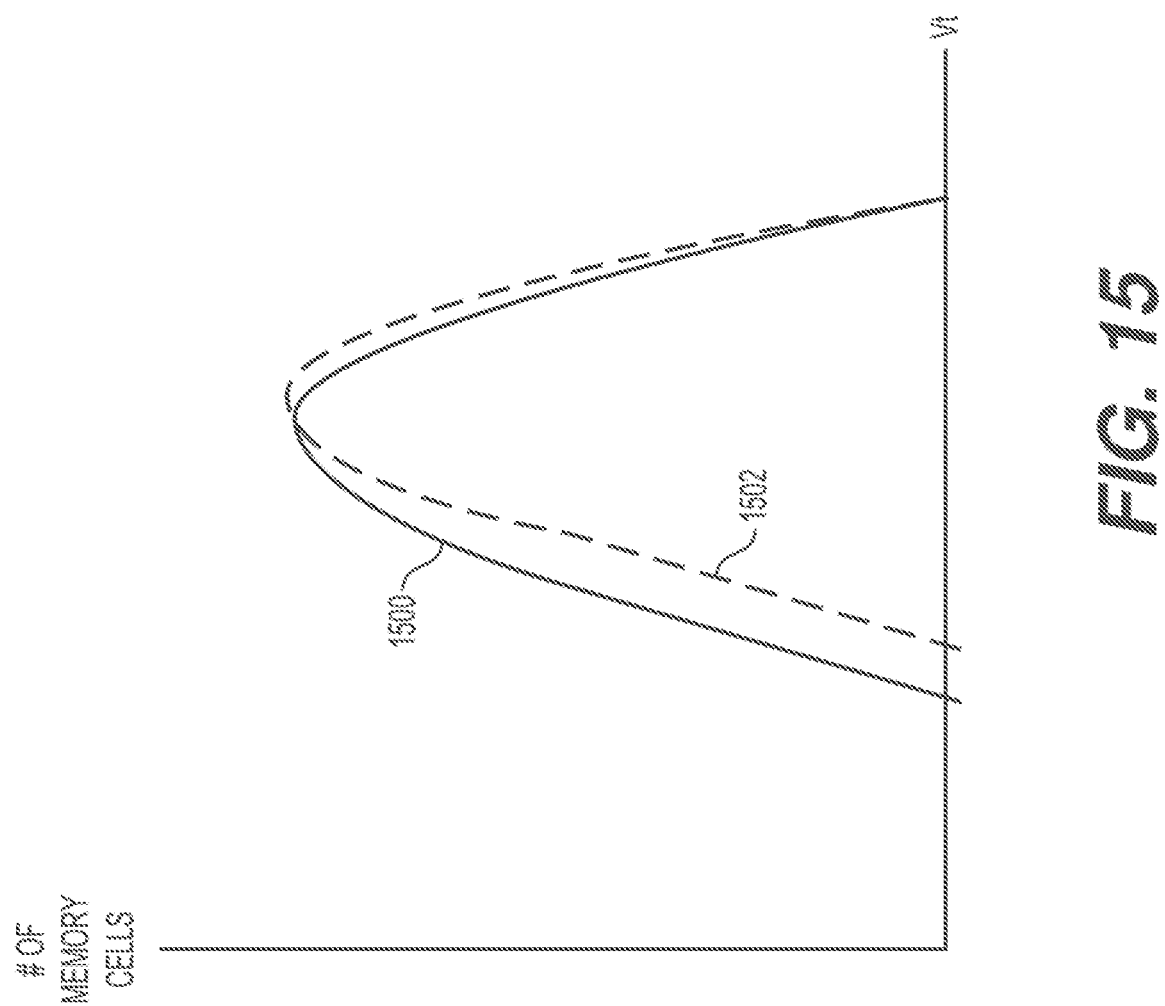
FIG. 15 is a threshold voltage distribution plot of a plurality of memory cells programmed both according to the techniques of the present disclosure and with a different programming technique.

At the beginning of a programming operation all of the memory cells of a selected word line are in the erased state, and therefore, very few of the memory cells are locked out. Accordingly, with reference still to FIG. 14, during the initial stages of a programming operation most of the cells conduct and the current Icell passes through most of the strings from the bit lines to the common source line. Since CELSRC bounce is a function of Icell, this results in a higher CELSRC bounce and the threshold voltages of many memory cells are read or sensed as being higher than they actually are. As a result, some memory cells that are below the verify levels of the data states they are being programmed to mistakenly pass verify. This produces a widened Vt distribution. For example, FIG. 15 illustrates two Vt distributions: a first distribution 1500 for a plurality of memory cells that are programmed with a large CELSRC bounce and a second distribution 1502 for a plurality of memory cells that are programmed without a CELSRC bounce. As illustrated, the lower tail of the first distribution 1500 is lower (worse) than the lower tail of the second distribution 1502. Thus, programming with a large CELSRC bounce results in a reduced (worse) Vt margin than programming with a lesser CELSRC bounce. As more and more memory cells being programmed to a given data state pass verify and are inhibited (i.e., are locked out) during the following program loops, CELSRC bounce reduces and the threshold voltages of the memory cells are read more and more correctly. Specifically, this improvement is realized because the VDS and VGS bias levels return to normal as an increasing number of bit lines are locked out and do not pass current during verify. VDS is the difference between the drain side voltage Vd and the source side voltage Vs in a NAND string, and VGS is the difference between the gate transistor of the selected word line Vg and the source side voltage Vs in a NAND string. However, the cells which wrongly "pass" verify as explained previously remain wrongly locked out, showing up as a worse lower tail as shown in FIG. 15. Thus, the lower tails of the memory cells programmed to each programmed data state (e.g., S1-S7 in the case of TLC) are all affected by CELSRC bounce and the cumulative reduction in all of these lower tails results in the decreased Vt margin.

One aspect of the present disclosure is related to a programming technique that allows the CELSRC drivers to be set to 0 V but without a Vt margin loss, i.e., both the reliability of programming with a CELSRC bias voltage and the performance of programming with the CELSRC drivers set to 0 V. As discussed in further detail below, these programming techniques include an extra verify or "re-verify" operation to detect if any of the memory cells mistakenly passed verify too early and, if so, to allow those memory cells receive another program pulse. Please note that this "re-verify" for the locked out cells could take place in the same program loop as the normal verify for other unlocked cells.

Figure 16:
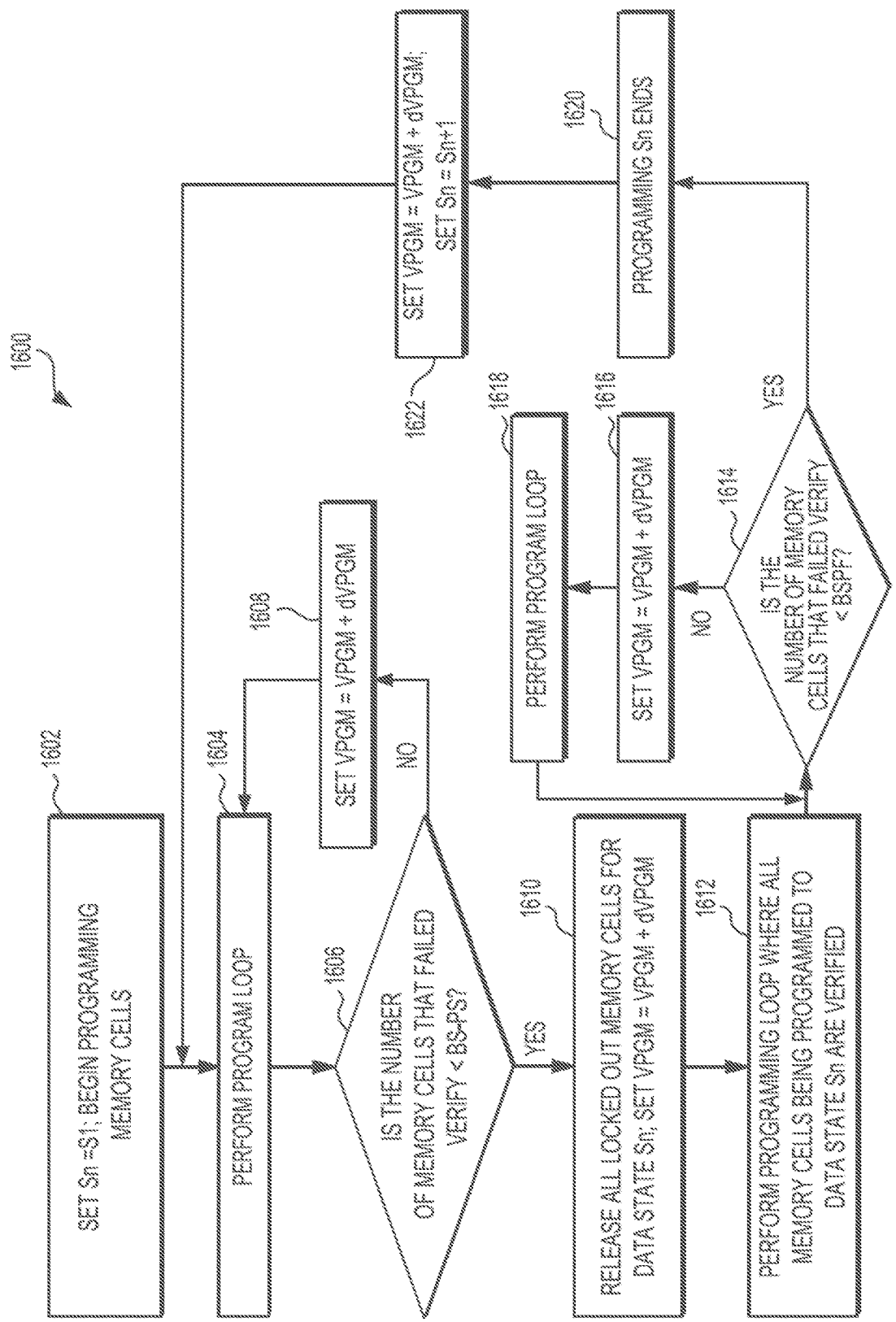
FIG. 16 is a flow chart of the steps of programming the memory cells of a selected word line according to an example embodiment of the present disclosure.

Turning now to FIG. 16, a flow chart 1600 containing the steps of programming the memory cells of a selected word line for each of the programmed data states according to an example embodiment is described. At step 1602, as soon as the verify operation for state Sn begins, the control circuitry begins the program-verify operation on the memory cells of the selected word line WLn to a selected data state Sn. Please note that there can be a few programming pulses applied to the cells of the state Sn even before verification of state Sn begins. This aspect is not covered by the flowchart 1600. The flowchart 1600 applies to each state and handled separately for each data state (e.g., S1-S7 in the case of TLC or S1-S15 in the case of QLC) using separate counters at any stage. Once programming of a data state is completed, its counters could be reassigned to the upcoming data state. It should be appreciated that while data state Sn is being programmed, verify can begin for additional data states, e.g., data states Sn+1 and Sn+2.

At step 1604, the control circuitry performs a programming loop on the selected word line. The programming loop includes the application of a programming pulse to the selected word line while any memory cell that have reached their intended data state are inhibited from programming. Following the programming pulse, a verify operation is performed on the selected word line to verify the Sn data state. In some embodiments, verify for a program loop can take place in parallel with the next programming pulse to improve performance. In some embodiments, more than one data state (for example, Sn, Sn+1, and Sn+2) can all be verified during the verify operation. Also at this step, the memory cells that failed verify for the data state Sn are counted. During the verify operation, the CELSRC drivers are set to zero Volts (0 V) or approximately 0 V.

At decision step 1606, it is determined if the number of memory cells that failed verify for data state Sn is less than a BS-PS threshold. The BS-PS threshold is selected such that the majority of the memory cells being programmed to the data state Sn are above the verify level Vvn (see, for example, FIG. 8 or FIG. 9) for data state Sn and a further shift in the effective verify level would be negligible. Thus, at the point where the selected word line passes decision step 1606, the CELSRC bounce is less pronounced than it was during the initial program loops when most memory cells being programmed to data state Sn have not passed verify and the current Icell flowing through the strings during the sensing operation is reduced.

If the answer at decision step 1606 is "no," then at step 1608, the programming pulse voltage VPGM is incrementally increased, i.e., VPGM=VPGM+dVPGM. The process then returns to step 1604.

If the answer at decision step 1606 is "yes," then at step 1610, all of the locked out (inhibited) memory cells for data state Sn are released (unlocked), and the programming pulse voltage VPGM is incrementally increased, i.e., VPGM=VPGM+dVPGM. At step 1612, another program loop is performed where all of the memory cells being programmed to data state Sn are unlocked and are verified, but only the memory cells that have not passed verify are programmed during the programming pulse. By unlocking all of the memory cells being programmed to data state Sn, any memory cells that mistakenly passed verify for data state Sn during the early program loops when CELSRC bounce was the highest can be captured and further programmed in one or more of the following program loops.

At step 1612, the control circuitry performs a program loop where all of the memory cells being programmed to data state Sn are verified. This re-verify operation occurs after many of the memory cells have been programmed past the verify voltage, and therefore, the CELSRC bounce is reduced during the re-verify process as compared to the earlier program loops. Thus, any memory cells that mistakenly passed verify for data state Sn during the early program loops because their effective threshold voltages were greater than the intended verify level due to CELSRC bounce was the highest can be captured and further programmed until they properly pass verify. Any memory cells which pass the re-verify process are locked out again.

At decision step 1614, it is determined if the number of memory cells that vailed verify is less than a bit scan pass fail (BSPF) threshold. The BSPF threshold is lower than the BS-PS threshold, i.e., a greater quantity of memory cells must pass verify to pass decision step 1614 than to pass decision step 1606. If the answer at decision step 1614 is "no," than at step 1616, the programming voltage VPGM is incrementally increased, i.e., VPGM=VPGM+dVPGM. At step 1618, a program loop is performed on the selected word line to program any unlocked memory cells. The process then returns to step 1614.

If the answer at decision step 1614 is "yes," then the process proceeds to step 1620 and programming of data state Sn ends.

By following this process, the threshold voltage Vt distributions for all of the programmed data states are tightened, thereby improving the Vt margin of the programmed memory cells in the selected word line and improving the reliability of the data programmed therein.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:
    preparing a memory block that includes a plurality of memory cells arranged in a plurality of word lines;

programming the memory cells in a selected word line of the plurality of word lines to respective ones of a plurality of programmed data states in a plurality of program loops, the plurality of program loops including verify operations;

in response to any of the memory cells in the selected word line passing verify for their respective programmed data states, locking out that memory cell from subsequent program pulses and verify operations; and for a selected programmed data state of the plurality of programmed data states, in response to a count of memory cells in the selected word line that fail the verify operation being less than a first threshold, re-verifying all of the memory cells in the selected word line that are being programmed to the selected programmed data state and releasing all memory cells that were locked out but fail re-verify in order to allow any memory cells that mistakenly passed verify to be programmed further.

2. The method as set forth in claim 1, wherein during the verify operations, a plurality of CELSRC drivers in the memory block are set to approximately zero Volts.

3. The method as set forth in claim 1, further including the step of, for the selected programmed data state, in response to a count of memory cells in the selected word line that fail the verify operation being less than a second threshold, ending programming to the selected programmed data state.

4. The method as set forth in claim 3, wherein the first threshold is greater than or equal to the second threshold.

5. The method as set forth in claim 1, further including the step of:

for a second programmed data state of the plurality of programmed data states, in response to a count of memory cells in the selected word line that fail the verify operation being less than the first threshold, re-verifying all of the memory cells in the selected word line that are being programmed to the second programmed data state and releasing all memory cells that were locked out but fail re-verify in order to allow any memory cells that mistakenly passed verify to be programmed further.

6. The method as set forth in claim 4, further including the step of, for the second programmed data state, in response to a count of memory cells in the selected word line that fail the verify operation being less than the second threshold, ending programming to the second programmed data state.

7. The method as set forth in claim 1, wherein the plurality of programmed data states includes at least seven programmed data states.

8. The method as set forth in claim 1, wherein a program pulse voltage VPGM is increased by a step size dVPGM between program loops.

9. A memory device, comprising:

a memory block that includes a plurality of memory cells arranged in a plurality of word lines;

control circuitry that is configured to program the memory cells in a selected word line of the plurality of word lines to respective ones of a plurality of programmed data states in a plurality of program loops, the plurality of program loops including verify operations, the control circuitry being further configured to:

in response to any of the memory cells in the selected word line passing verify for their respective programmed data states, lock out that memory cell from subsequent program pulses and verify operations; and for a selected programmed data state of the plurality of programmed data states, in response to a count of memory cells in the selected word line that fail the verify operation being less than a first threshold, re-verify all of the memory cells in the selected word line that are being programmed to the selected programmed data state and release all memory cells that were locked out but fail re-verify in order to allow any memory cells that mistakenly passed verify to be programmed further.

10. The memory device as set forth in claim 9, wherein during the verify operations, the control circuitry sets a plurality of CELSRC drivers in the memory block to approximately zero Volts.

11. The memory device as set forth in claim 9, wherein the control circuitry is further configured to, for the selected programmed data state, end programming to the selected programmed data state in response to a count of memory cells in the selected word line that fail the verify operation being less than a second threshold.

12. The memory device as set forth in claim 11, wherein the first threshold is greater than the second threshold.

13. The memory device as set forth in claim 9, wherein for a second programmed data state of the plurality of programmed data states, the control circuitry is further configured to:

re-verify all of the memory cells in the selected word line that are being programmed to the second programmed data state and release all memory cells that were locked out but fail re-verify in order to allow any memory cells that mistakenly passed verify to be programmed further in response to a count of memory cells in the selected word line that fail the verify operation being less than the first threshold.

14. The memory device as set forth in claim 13, wherein for the second programmed data state, the control circuitry is configured to end programming to the second programmed data state in response to a count of memory cells in the selected word line that fail the verify operation being less than the second threshold.

15. The memory device as set forth in claim 9, wherein the plurality of programmed data states includes at least seven programmed data states.

16. The memory device as set forth in claim 9, wherein the control circuitry is further configured to increase a program pulse voltage VPGM by a step size dVPGM between program loops.

17. An apparatus, comprising:

a memory block that includes a plurality of memory cells arranged in a plurality of word lines;

a programming means for programming the memory cells in a selected word line of the plurality of word lines to respective ones of a plurality of programmed data states in a plurality of program loops, the plurality of program loops including verify operations, the programming means being further configured to:

in response to any of the memory cells in the selected word line passing verify for their respective programmed data states, lock out that memory cell from subsequent program pulses and verify operations; and for each programmed data state of the plurality of programmed data states, in response to a count of memory cells in the selected word line that fail the verify operation being less than a first threshold, re-verify all of the memory cells in the selected word line that are being programmed to that programmed data state and release all memory cells that were locked out but fail re-verify in order to allow any memory cells that mistakenly passed verify to be programmed further.

18. The apparatus as set forth in claim 17, wherein the programming means is further configured to, for each of the plurality of programmed data states, end programming to the respective programmed data state in response to a count of memory cells in the selected word line that fail the verify operation being less than a second threshold.

19. The apparatus as set forth in claim 18, wherein the first threshold is greater than the second threshold.

20. The apparatus as set forth in claim 17, wherein the plurality of programmed data states includes at least seven programmed data states.

* * * * *